(12) United States Patent
Miyazaki

(10) Patent No.: US 6,268,771 B1
(45) Date of Patent: Jul. 31, 2001

(54) AMPLIFYING DEVICE

(75) Inventor: Katsumi Miyazaki, Tokyo (JP)

(73) Assignees: Mitsubishi Denki Kabushiki Kaisha; Mitsubishi Electric Engineering Co., Ltd., both of Tokyo (JP)

(*) Notice: Subject to any disclaimer, the term of this patent is extended or adjusted under 35 U.S.C. 154(b) by 0 days.

(21) Appl. No.: 09/523,650

(22) Filed: Mar. 10, 2000

(30) Foreign Application Priority Data

Mar. 29, 1999 (JP) .................................................. 11-085956
Oct. 7, 1999 (JP) .................................................. 11-286413

(51) Int. Cl.[7] .................................................. H03F 3/26
(52) U.S. Cl. .................................................. 330/269; 330/273
(58) Field of Search .................................................. 330/269, 273, 330/274, 300

(56) References Cited

U.S. PATENT DOCUMENTS 5,684,432 * 11/1997 Embree .................................................. 330/269

FOREIGN PATENT DOCUMENTS

0153250 * 8/1985 (EP) .................................................. 330/269
8-78972   3/1996 (JP) .

* cited by examiner

*Primary Examiner*—Steven J. Mottola
(74) *Attorney, Agent, or Firm*—Burns, Doane, Swecker & Mathis, LLP

(57) ABSTRACT

A MOSFET (1) performing a current source operation and a MOSFET (2) performing a current sink operation are both of n-channel type. An input voltage (Vin) to be inputted to a gate electrode of the MOSFET (2) is divided by two resistance elements (6 and 7) and then inputted to the gate electrode of the MOSFET (2). A transistor (4) is disposed between a drain electrode of a MOSFET (3) and a gate electrode of the MOSFET (1). A constant current (Ib1) supplied by a constant current source (8) separately flows into the transistor (4) and a resistance element (5). A constant reference voltage(Va) is inputted to a base electrode of the transistor (4), which is low enough to operate the MOSFET (3) within a triode region. This configuration achieves both larger dynamic range and easier control of idling current.

20 Claims, 19 Drawing Sheets

F I G. 20
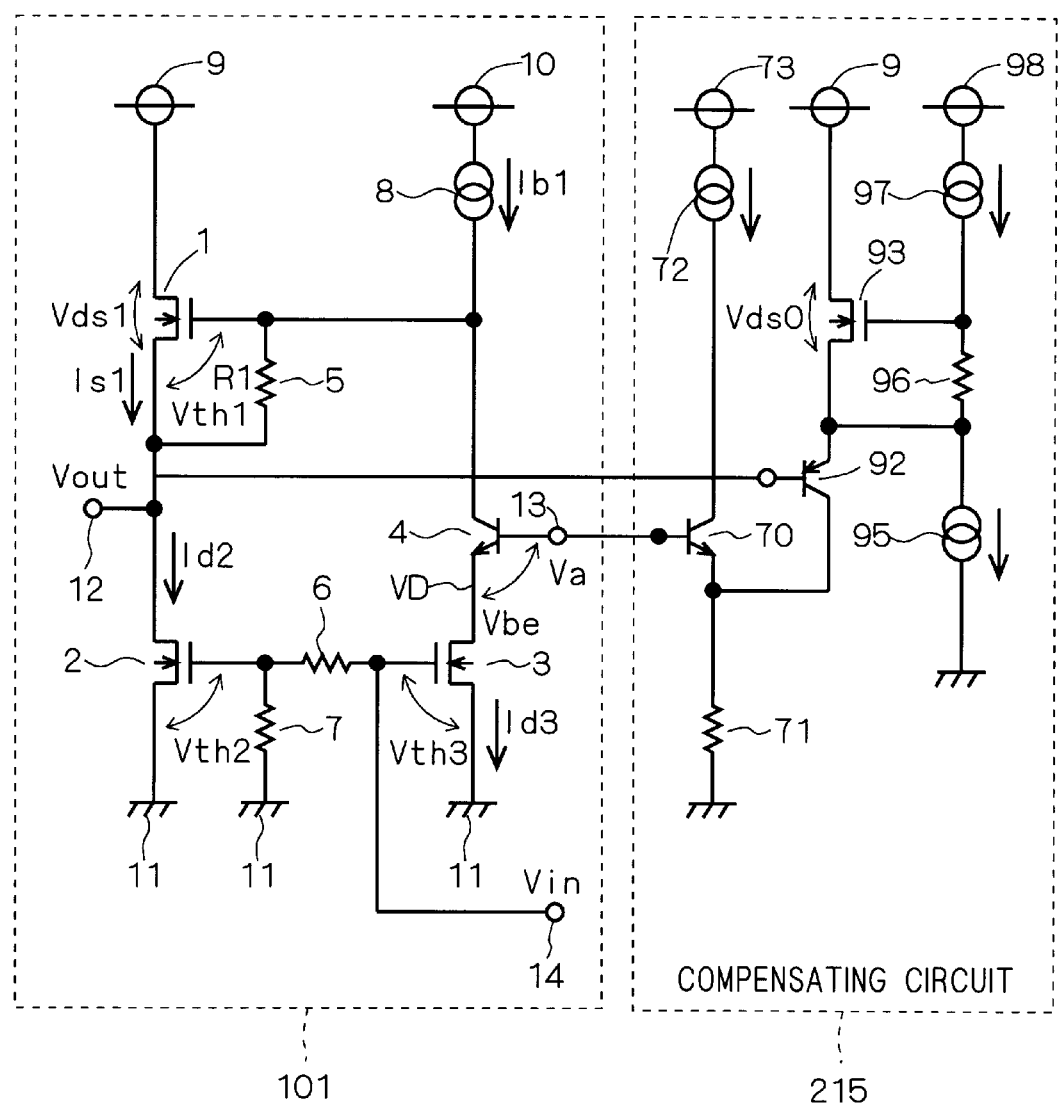

FIG. 25A Vin
FIG. 25B Vout1
FIG. 25C Vout
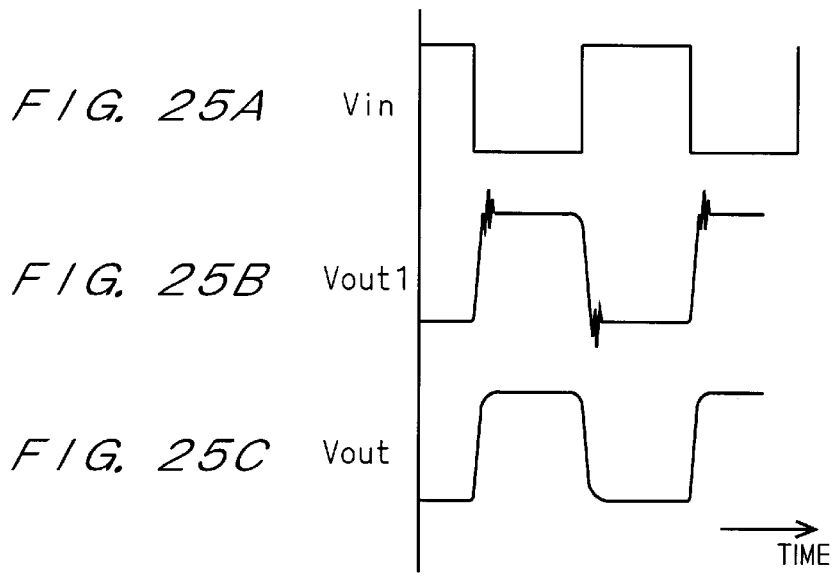
FIG. 26
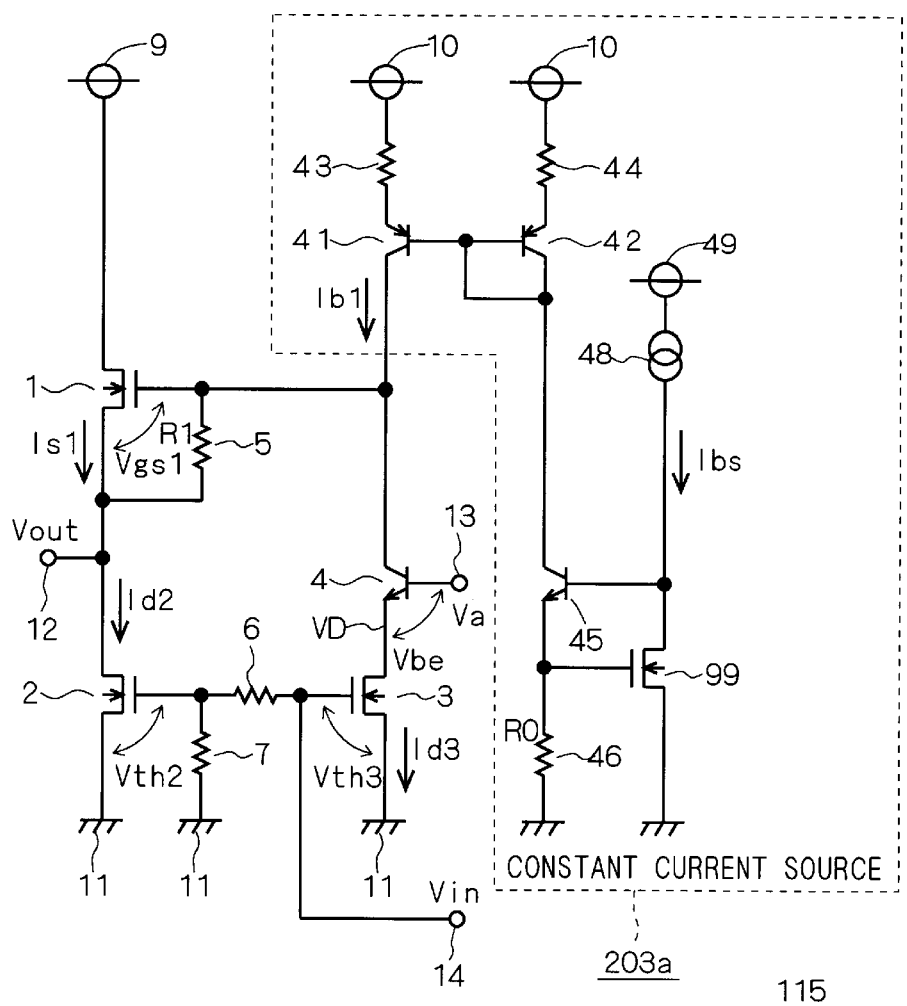

AMPLIFYING DEVICE

BACKGROUND OF THE INVENTION

1. Field of the Invention

The present invention relates to an amplifying device, and more particularly to an improvement for achieving both larger dynamic range and easier control of idling current.

2. Description of the Background Art

In many cases, a power amplifying device has a configuration of a push-pull type class AB amplifying device in which two transistors are combined. A class AB amplifying device, comprising a transistor for drawing an output current out from a positive power supply line to a load and a transistor for drawing the output current from the load into a negative power supply line, alternately turns the two transistors on to achieve draw-out and draw-in of the output current and turns both the transistors on in some degree at switching between the draw-out and draw-in.

Therefore, the class AB amplifying device has an advantage of saving a consumption current since only a very small amount of idling current flows from one transistor to the other when the output current is zero. Further, since the two transistors do not turn off simultaneously, it is advantageously possible to suppress crossover distortion and improve switching characteristics.

A background-art class AB amplifying device using MOSFETs has a configuration of combining a source follower of an n-channel type MOSFET and that of a p-channel type MOSFET. FIG. 26 is a circuit diagram showing an exemplary configuration of such a background-art class AB amplifying device. In the device 150, an n-channel type MOSFET 161 and a p-channel type MOSFET 162 of which source electrodes are connected to each other are disposed between a positive power supply line 163 and a negative power supply line 164. An output terminal 165 is connected to a node between the two source electrodes.

Further, between a positive power supply line 170 and a negative power supply line 171 disposed is a series circuit in which a resistance element 169, an n-channel type MOSFET 166, a p-channel type MOSFET 167 and an n-channel type MOSFET 168 are connected in this order. Drain electrodes of the MOSFETs 166 and 167 are connected to each other. A gate electrode and a source electrode of the MOSFET 166 are connected to each other and similarly a gate electrode and a source electrode of the MOSFET 167 are connected to each other. A node between the resistance element 169 and the source electrode of the MOSFET 166 is connected to a gate electrode of the MOSFET 161, and a node between a drain electrode of the MOSFET 168 and the source electrode of the MOSFET 167 is connected to a gate electrode of the MOSFET 162. Further, an input terminal is connected to a gate electrode of the MOSFET 168.

When a voltage to make the MOSFET 168 full-on is applied as an input voltage Vin, a large amount of current flows in the resistance element 169 through the MOSFETs 166 and 167. That increases a voltage drop across the resistance element 169, and hence gate voltages of the MOSFETs 161 and 162 drop. As a result, the MOSFET 161 turns off and the MOSFET 162 turns on. An output current is thereby drawn from a load into the negate power supply line 164 through the output terminal 165.

On the other hand, when a voltage to make the MOSFET 168 full-off is applied as the input voltage Vin, only a small amount of current flows in the resistance element 169. That decreases the voltage drop across the resistance element 169, and hence the gate voltages of the MOSFETs 161 and 162 rise. As a result, the MOSFET 161 turns on and the MOSFET 162 turns off. The output current is thereby drawn out from the positive power supply line 163 to the load through the output terminal 165.

Thus, in response to the input voltage Vin, draw-out of the output current (current source) and draw-in thereof (current sink) are performed. The MOSFETs 166 and 167 serve to create a potential difference between the gate electrodes of the MOSFETs 161 and 162. At switching between the current sink and the current source, a current proportional to a current flowing in the MOSFETs 166 and 167 flows from the MOSFET 161 to the MOSFET 162 as an idling current. That achieves a class AB operation where the MOSFETs 161 and 162 do not turn off simultaneously.

The device 150 has a problem in being incorporated as an IC (Integrated Circuit) in a single semiconductor chip as follows. In the IC, usually, the negative power supply lines 164 and 171 are formed as a common ground power supply line. That causes a problem that an output voltage Vout can not be less than a value obtained by adding a source-drain voltage of the MOSFET 168 and the gate-source voltage of the MOSFET 162 when the MOSFET 168 is made full-on to a negative power supply potential −Vcc of the negative power supply line 164.

Specifically, a dynamic range of the output voltage Vout is disadvantageously limited smaller than a potential difference (power supply voltage) between a positive power supply potential Vcc and the negative power supply potential −Vcc. In a largely-rated amplifying device, a gate-source voltage to make the MOSFET full-on is high and when the power supply voltage is low, a ratio of lost dynamic range to the power supply voltage is not negligible. The problem is pronounced when an IC is used for portable electronics using battery as power supply.

As a solution of this problem known is an amplifying device comprising two n-channel type MOSFETs connected in series between a positive power supply line and a negative power supply line, two preliminary amplifiers to separately control these two MOSFETs and another MOSFET to prevent these two MOSFETs from turning on simultaneously, to achieve a class AB operation. This device, however, has a problem that it is not easy to control the idling current of the two MOSFETs and switching distortion and a through current (excessive idling current) are likely to be caused.

SUMMARY OF THE INVENTION

The present invention is directed to an amplifying device. In the present invention, "conductivity type" of a transistor means pnp-type or npn-type in a case of a bipolar transistor and means n-channel type or p-channel type in a case of a MOSFET. According to a first aspect of the present invention, the amplifying device comprises: a first MOSFET having a drain electrode connected to a first power supply line; a second MOSFET of the same channel type as the first MOSFET, having a source electrode connected to a second power supply line and a drain electrode connected to a source electrode of the first MOSFET; a third MOSFET of the same channel type as the first MOSFET, having a source electrode connected to the second power supply line and a gate electrode connected to a gate electrode of the second MOSFET; a first resistance element having two ends, one end being connected to a gate electrode of the first MOSFET and the other end being connected to the source electrode of the first MOSFET; a control circuit having first to third electrodes, the first electrode being connected to a drain electrode of the third MOSFET, the second electrode being connected to the gate electrode of the first MOSFET, a potential difference between the first electrode and the second power supply line is determined by a voltage applied across the third electrode and the second power supply line, and a current flowing in the second electrode being in proportion to a current flowing in the first electrode; and a first constant current source having an output end connected to the second electrode.

According to a second aspect of the present invention, the amplifying device comprises: a first MOSFET having a drain electrode connected to a first power supply line; a second MOSFET of the same channel type as the first MOSFET, having a source electrode connected to a second power supply line and a drain electrode connected to a source electrode of the first MOSFET; a third MOSFET of the same channel type as the first MOSFET, having a source electrode connected to the second power supply line and a gate electrode connected to a gate electrode of the second MOSFET; a first resistance element having two ends, one end being connected to a gate electrode of the first MOSFET and the other end being connected to the source electrode of the first MOSFET; a first transistor having a first main electrode connected to a drain electrode of the third MOSFET, a second main electrode connected to the gate electrode of the first MOSFET and a control electrode, in which a current flowing in the second main electrode is controlled by a potential difference between the control electrode and the first main electrode; and a first constant current source having an output end connected to the second electrode.

Preferably, the amplifying device according to the second aspect further comprises: a second transistor of the same conductivity type as the first transistor having a first main electrode and a second main electrode and a control electrode both of which are connected to the control electrode of the first transistor; a second resistance element having two ends, one end being connected to the first main electrode of the second transistor and the other end being connected the second power supply line; a third transistor of the same conductivity type as the first transistor having a first main electrode, a second main electrode and a control electrode; a third resistance element having two ends, one end being connected to the first main electrode of the third transistor and the other end being connected to the second power supply line; a current mirror circuit having two output ends respectively connected to the second main electrodes of the second and third transistors; and a circuit for holding a potential of the one end of the third resistance element at t reference voltage inputted from an outside of the amplifying device.

Preferably, the amplifying device according to the second aspect further comprises: a second transistor of the same conductivity type as the first transistor having a first main electrode, a second main electrode and a control electrode; a second resistance element having two ends, one end being connected to said first main electrode of the second transistor and the other end being connected to the second power supply line; a current mirror circuit having two output ends respectively connected to the second main electrodes of the first and second transistors; and a circuit for holding a potential of the one end of the second resistance element at a reference voltage inputted from an outside of the amplifying device.

Preferably, the amplifying device according to the second aspect further comprises: a second transistor having a first main electrode, a second main electrode connected to the second main electrode of the first transistor, and a control electrode; a second resistance element having two ends, one end being connected to the first main electrode of the second transistor and the other end being connected to a third power supply line; a third transistor of the same conductivity type as the second transistor having a first main electrode, a second main electrode, and a control electrode connected to the control electrode of the second transistor; a third resistance element having two ends, one end being connected to the first main electrode of the third transistor and the other end being connected to the third power supply line; a third resistance element having two ends, one end being connected to the second main electrode of the third transistor and the other end being connected to the second power supply line; and a differential amplifier having an output connected to the control electrodes of the second and third transistors, a non-reverse input connected to the main electrode of the third transistor, and a reverse input.

Preferably, the amplifying device according to the second aspect further comprises: a second transistor of the same conductivity type as the first transistor having a first main electrode and a second main electrode and a control electrode both of which are connected to the control electrode of the first transistor; a second resistance element having two ends, one end being connected to the first main electrode of the second transistor and the other end being connected to the second power supply line; a second current source having an output end connected to the second main electrode of the second transistor; a fourth MOSFET of the same channel type as the first MOSFET, having a source electrode connected to the second power supply line, a drain electrode, and a gate electrode; and a current mirror circuit having two output ends respectively connected to the first main electrode of the second transistor and the drain electrode of the fourth MOSFET.

Preferably, the amplifying device according to the second aspect further comprises: a fourth MOSFET of the same channel type as the first MOSFET, having a source electrode connected to the second power supply line, a drain electrode connected to the output end of the first constant current source, and a gate electrode.

Preferably, the amplifying device according to the second aspect further comprises: a fourth MOSFET of the same channel type as the first MOSFET, having a drain electrode connected to the first power supply line; a second resistance element having two ends, one end being connected to a source electrode of the fourth MOSFET and the other end being connected to a gate electrode of the fourth MOSFET; a second constant current source for supplying a constant current for the second resistance element; a second transistor having a first main electrode connected to the source electrode of the fourth MOSFET, a control electrode connected to the source electrode of the first MOSFET, and a second main electrode; and a current mirror circuit having two output ends respectively connected to the output end of the first constant current source and the second main electrode of the second transistor.

Preferably, the amplifying device according to the second aspect further comprises: a fourth MOSFET of the same channel type as the first MOSFET, having a drain electrode connected to the first power supply line; a second resistance element having two ends, one end being connected to a source electrode of the fourth MOSFET and the other end being connected to a gate electrode of the fourth MOSFET; a second constant current source for supplying a constant current for the second resistance element; a second transistor having a first main electrode connected to the source electrode of the fourth MOSFET, a control electrode connected to the source electrode of the first MOSFET, and a second main electrode; a third transistor of the same conductivity type as the first transistor having a first main electrode connected to the second main electrode of the second transistor, a control electrode connected to the control electrode of the first transistor, and a second main electrode; a third resistance element having two ends, one end being connected to the first main electrode of the third transistor and the other end being connected to the second power supply line; and a third current source having an output end connected to the second main electrode of the third transistor.

According to a third aspect of the present invention, in the amplifying device according to the second aspect, the first transistor is a bipolar transistor.

According to a fourth aspect of the present invention, in the amplifying device according to the second aspect, the first transistor is a MOSFET of the same channel type as the first to third MOSFETs.

According to a fifth aspect of the present invention, the amplifying device according to one of the first to fourth aspects further comprises: a second resistance element having two ends, one end being connected to the gate electrode of the second MOSFET and the other end being connected to the gate electrode of the third MOSFET; and a third resistance element having two ends, one end being connected to the gate electrode of the second MOSFET and the other end being connected to the second power supply line.

According to a sixth aspect of the present invention, the amplifying device according to one of the second to fifth aspects further comprises: a first compensating circuit for compensating the potential difference between the control electrode and the first main electrode of the first transistor, and in the device of the sixth aspect, the first compensating circuit comprises a constant voltage circuit for outputting a constant voltage relative to the second power supply line to an output end thereof; a second transistor having a first main electrode connected to the output end of the constant voltage circuit, a second main electrode and a control electrode both of which are connected to the control electrode of the first transistor; and a second constant current source having an output end connected to the second main electrode of the second transistor.

Preferably, the second transistor is paired with the first transistor.

According to a seventh aspect of the present invention, in the amplifying device according to one of the first to sixth aspects, the first constant current source comprises a fourth resistance element; and a current source for outputting a current in proportion to a current flowing in the fourth resistance element to the output end of the first constant current source.

Preferably, the fourth resistance element is paired with the first resistance element.

According to an eighth aspect of the present invention, the amplifying device according to one of the first to seventh aspects further comprises: a second compensating circuit for compensating threshold voltages of the first to third MOSFETs, and in the device of the tenth aspect, the second compensating circuit comprises a fourth MOSFET of the same channel type as the first to third MOSFETs, having a source electrode connected to the second power supply line; and a first current control circuit for diluting a current flowing in the first resistance element with a current in proportion to a current flowing in the fourth MOSFET.

Preferably, the first to fourth MOSFETs are paired with one another.

According to a ninth aspect of the present invention, the amplifying device according to one of the first to eighth aspects further comprises: a third compensating circuit for compensating voltage dependency of a current in the first MOSFET, and in the device of the twelfth aspect, the third compensating circuit comprises a fifth MOSFET of the same channel type as the first to third MOSFETs, having a drain electrode connected to the first power supply line; a fifth resistance element having two ends, one end being connected to a source electrode of the fifth MOSFET and the other end being connected to a gate electrode of the fifth MOSFET; a third constant current source for supplying a constant current for the fifth resistance element; a feedback circuit for propagating variation in potential of a node between the source electrode of the first MOSFET and the drain electrode of the second MOSFET to the source electrode of the fifth MOSFET; and a second current control circuit for diluting a current flowing in the first resistance element with a current proportional to a current flowing in the fifth MOSFET.

Preferably, the fifth MOSFET is paired with the first MOSFET, the fifth resistance element is paired with the first resistance element, and the third constant current source is paired with the first constant current source.

According to a tenth aspect of the present invention, the amplifying device according to one of the first to ninth aspects further comprises: an amplifier having an output connected to the gate electrode of the third MOSFET.

According to an eleventh aspect of the present invention, in the amplifying device according to the tenth aspect, the amplifier is a differential amplifier having a non-reverse input and a reverse input, and the amplifying device of the fifteenth aspect further comprise: a negative feedback loop for connecting the non-reverse input to a node between the source electrode of the first MOSFET and the drain electrode of the second MOSFET.

According to a twelfth aspect of the present invention, in the amplifying device according to any one of the first to fifth aspects, the first constant current source comprises a fourth MOSFET of the same channel type as the first MOSFET; a second resistance element having ends, one of the ends being connected to a gate electrode of the fourth MOSFET and the other being connected to a source electrode of the fourth MOSFET; a second constant current source having an output end connected to a drain electrode of the fourth MOSFET; a second transistor having a first main electrode and a control electrode connected to the gate electrode and the drain electrode of the fourth MOSFET, respectively; and a current mirror circuit for outputting a current in proportion to a main current flowing in the second transistor from the output end of the first constant current source.

Preferably, the second transistor is a bipolar transistor.

According to a thirteenth aspect of the present invention, in the amplifying device according to the twelfth aspect, the fourth resistance element is paired with the first resistance element, and the fourth MOSFET is paired with the first MOSFET.

According to a fourteenth aspect of the present invention, in the amplifying device according to any one of the second to fifth aspects further comprises: a second transistor of the same conductivity type as the first transistor, having a first main electrode to which a voltage is applicable and a second main electrode and a control electrode which are connected to the control electrode of the first transistor; a third transistor having a first main electrode connected to the second main electrode of the first transistor and a second main electrode connected to the output end of the first constant source, thereby being interposed between the first transistor and the output end; a fourth transistor of the same conductivity type as the third transistor, having a first main electrode connected to the second main electrode of the second transistor and a second main electrode and a control electrode which are connected to a control electrode of the third transistor; and a second constant current source having an output end connected to the a second main electrode of the fourth transistor.

Preferably, both the first and second transistors are bipolar transistors.

Preferably, both the third and fourth transistors are MOSFETs.

According to a fifteenth aspect of the present invention, in the amplifying device according to the fourteenth aspect, the second transistor is paired with the first transistor, and the fourth transistor is paired with the third transistor.

In the amplifying device of the first aspect, by applying the input voltage to the gate electrode of the third MOSFET, an output current and an output voltage are obtained from a node between the first and second MOSFETs. Since the first and second MOSFETs are of the same channel type (conductivity type), larger dynamic range of the output voltage is ensured. Moreover, by controlling parameters including threshold voltages of the first to third MOSFETs, a wide range of idling current can be set. In short, both larger dynamic range and easier setting of idling current can be achieved. Especially, by applying such a constant voltage as the third MOSFET may operate in a triode region to the third electrode, symmetry between a current source operation and a current sink operation can be enhanced.

The device of the second aspect, like the device of the first aspect, can achieve both larger dynamic range and easier setting of idling current. Moreover, since the control circuit of the device of the first aspect is replaced by the transistor, the configuration of the device is simpler. Further, by applying such a constant voltage as the third MOSFET may operate in the triode region to the control electrode of the transistor, symmetry between the current source operation and the current sink operation can be enhanced.

In the device of the third aspect, since the first transistor is a bipolar transistor, it becomes easier to suppress variation in a base-emitter voltage of the transistor for higher uniformity in characteristics of products.

In the device of the fourth aspect, since the first transistor is a MOSFET of the same channel type as the first to third MOSFETs, simpler process and lower cost of manufacture can be achieved.

In the device of the fifth aspect, since the second and third resistance elements are provided, through fine-tuning of the resistances of the second and third resistance elements, fine-tuning of the idling current can be easily achieved.

In the device of the sixth aspect, the potential difference between the control electrode and the first main electrode of the first transistor is compensated with the potential difference between the control electrode and the first main electrode of the second transistor and the constant voltage outputted from the constant voltage circuit is propagated to the drain electrode of the third MOSFET. Therefore, the effect due to the potential difference between the control electrode and the first main electrode of the first transistor is suppressed and a stable operation of the device is ensured.

In the device of the seventh aspect, by applying the constant voltage to one end of the fourth resistance element, a gate-source voltage of the first MOSFET in proportion to a ratio of the resistance of the first resistance element to that of the fourth element can be obtained. Therefore, the effect due to the variation in the resistance of the first resistance element on the gate-source voltage of the first MOSFET is suppressed and a stable operation of the device is ensured.

In the device of the eighth aspect, when the constant voltage is applied to the gate electrode of the fourth MOSFET, the current flowing in the first resistance element so varies as to dilute the effect due to the variations in the threshold voltages of the first to third MOSFETs with the variation in the threshold voltage of the fourth MOSFET. Therefore, the effect due to the variations in the threshold voltages of the first to third MOSFETs is suppressed and a stable idling current can be obtained.

In the device of the ninth aspect, the current flowing in the first resistance element so varies as to dilute the effect due to the dependency of the drain current of the first MOSFET on the drain-source voltage, which is caused by the variation in the output voltage, with the dependency of the drain current of the fifth MOSFET on the drain-source voltage. Therefore, the effect due to the dependency of the drain current of the first MOSFET on the drain-source voltage is suppressed and a stable idling current can be obtained.

The device of the tenth aspect, comprising the preliminary amplifier, can be used as an amplifier with current buffer or a comparator having larger dynamic range and less crossover distortion. Further, since the idling current can be controlled so that the first and second MOSFETs on the last stage may not simultaneously turn off, it is possible to suppress oscillation, chattering, spike or the like in the output voltage.

The device of the eleventh aspect, comprising the differential amplifier provided on the ante-stage negatively fed back with the output voltage on the last stage, can be used as an amplifier with current buffer capable of performing various arithmetic operations.

In the amplifying device of the twelfth aspect, since the variation in resistance of the first resistance element is compensated by the fourth resistance element and the variation in characteristics of the first MOSFET is compensated by the fourth MOSFET, an effect on an idling current due to these variations can be relieved.

In the amplifying device of the thirteenth aspect, the elements which compensate variation in characteristics each other are paired, the variation in characteristics is effectively compensated. As a result, the effect on the idling current due to the variation in characteristics is more effectively relieved.

In the amplifying device of the fourteenth aspect, since the voltage difference between the control electrode and the first main electrode of the first transistor is compensated by that of the second transistor, the voltage applied to the first main electrode of the second transistor is transferred to the drain electrode of the third MOSFET. Therefore, an effect due to the variation in the voltage difference between the control electrode and the first main electrode of the first transistor is suppressed, to stabilize the idling current. Moreover, the voltage difference between the first main electrode and the second main electrode of the first transistor is clamped to the voltage difference between the first main electrode and the control electrode thereof by the third and fourth transistors. Therefore, even a slight variation in the voltage of the drain electrode of the third MOSFET due to the variation in the voltage difference between the first and second main electrodes of the first transistor is suppressed, to enhance stability of the idling current. Further, it is not necessary to adopt an element having high withstand voltage for the first transistor.

In the amplifying device of the fifteenth aspect, since the elements which compensate variation in characteristics each other are paired, the variation in characteristics is effectively compensated. As a result, the stability of the idling current is further enhanced.

An object of the present invention is to provide an amplifying device for achieving both larger dynamic range and easier control of idling current.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B to FIG. 4 are graphs showing an operation of the device of FIG. 1;

FIG. 20 is a circuit diagram showing another example of device in accordance with the fifth preferred embodiment;

FIGS. 25A to 25C are waveform views showing an operation of the device of FIG. 23;

FIG. 26 is a circuit diagram of a device in accordance with an eighth preferred embodiment;

DESCRIPTION OF THE PREFERRED EMBODIMENTS

<1. The First Preferred Embodiment>

Discussion will be presented first on the first preferred embodiment of the present invention.

<1.1. Configuration>

Figure 1:
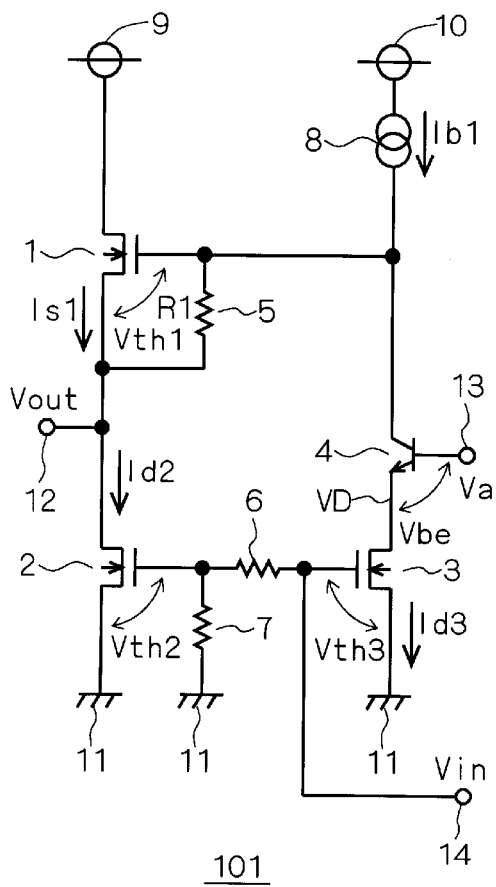
FIG. 1 is a circuit diagram of a device in accordance with a first preferred embodiment.

FIG. 1 is a circuit diagram showing a configuration of an amplifying device 101 in accordance with the first preferred embodiment. The device 101 is configured as a class AB amplifier using MOSFETs. In the device 101, both a MOSFET 1 for draw-out of an output current (current source) and a MOSFET 2 for draw-in of the output current (current sink) are configured as n-channel type MOSFETs.

A drain electrode of the MOSFET 1 is connected to a positive power supply line 9. A source electrode of the MOSFET 2 is connected to a ground power supply line 11, and a drain electrode thereof is connected to a source electrode of the MOSFET 1. An output terminal 12 is connected to a node between the MOSFETs 1 and 2. A resistance element 5 has two ends, and one end is connected to the source electrode of the MOSFET 1 and the other end is connected to the gate electrode thereof.

A MOSFET 3 has the same n-channel type as the MOSFETs 1 and 2, whose source electrode is connected to the ground power supply line 11 and gate electrode is connected to a gate electrode of the MOSFET 2 through a resistance element 6. An input terminal 14 is connected to a gate electrode of the MOSFET 3. The gate electrode of the MOSFET 2 is connected to the ground power supply line 11 through a resistance element 7.

A transistor 4 is an npn-type bipolar transistor whose emitter electrode is connected to a drain electrode of the MOSFET 3 and collector electrode is connected to the gate electrode of the MOSFET 1. Another input terminal 13 is connected to a base electrode of the transistor 4. An output end of a constant current source 8 is connected to a node between the collector electrode of the transistor 4 and the gate electrode of the MOSFET 1. The constant current source 8 is also connected to a positive power supply line 10 and outputs a constant current by its output end.

<1.2. Current Source Operation and Current Sink Operation>

The device 101 having the above configuration performs the following operation. To operate the device 101, a constant voltage is supplied for the input terminal 13 as a reference voltage Va. When a voltage lower than a threshold voltage Vth3 of the MOSFET 3 is inputted to the input terminal 13 as the input voltage Vin, the MOSFET 3 turns off. At this time, most of a current Ib1 supplied by the constant current source 8 flows into the resistance element 5. A resistance R1 of the resistance element 5 is determined so that a voltage drop due to the current Ib1 may be much larger than a threshold voltage Vth1 of the MOSFET 1. Therefore, when the current Ib1 flows in the resistance element 5, the MOSFET 1 turns on (conducts).

The gate voltage (gate-source voltage) of the MOSFET 2 is equal to a voltage obtained by dividing the input voltage Vin by two resistance elements 6 and 7. Resistances of the resistance elements 6 and 7 are determined so that the gate voltage of the MOSFET 2 may be lower than a threshold voltage Vth2 of the MOSFET 2 when the input voltage Vin is lower than the threshold voltage Vth3 of the MOSFET 3. Therefore, the MOSFET 2 turns off (is broken).

Figure 2A:
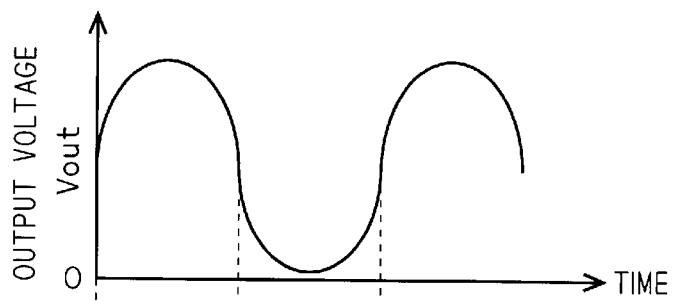
Figure 2B:
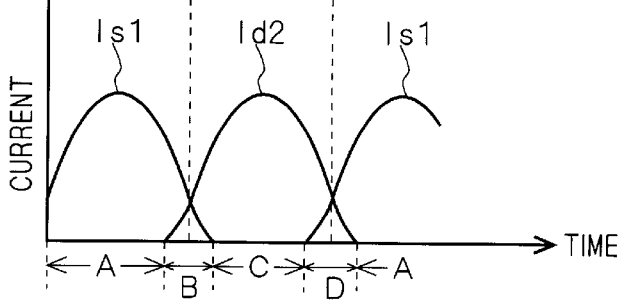

The MOSFET 1 turns on and the MOSFET 2 turns off, and consequently a whole source current Is1 flowing in the MOSFET 1 is drawn out as the output current to a not-shown load connected to the output terminal 12. This current source operation corresponds to an operation of period A in FIGS. 2A and 2B. FIG. 2A shows a waveform of the output voltage Vout (voltage of the output terminal 12) and FIG. 2B shows waveforms of the current Is1 and a current Id2 (a drain current of the MOSFET 2) when the input voltage Vin is applied under negative feedback control to make the output voltage in a form of sine wave as shown in FIG. 2A.

When a voltage much higher than the threshold voltage Vth3 of the MOSFET 3 is applied as the input voltage Vin, the MOSFET 3 turns on. At this time, most of a current Ib1 supplied by the constant current source 8 flows into the MOSFET 3 through the transistor 4. Since little voltage drop is developed across the resistance element 5, the MOSFET 1 turns off.

The resistances of the resistance elements 6 and 7 are determined so that the gate voltage of the MOSFET 2 may be higher than the threshold voltage Vth2 of the MOSFET 2 when the input voltage Vin is much higher than the threshold voltage Vth3 of the MOSFET 3. It is possible to determine the resistances of the resistance elements 6 and 7 so that the above and this conditions may be satisfied. Therefore, the MOSFET 2 turns on.

The MOSFET 1 turns off and the MOSFET 2 turns on, and consequently the output current is drawn in from the load as the drain current Id2 of the MOSFET 2. This current sink operation corresponds to an operation of period C in FIG. 2B. Since the MOSFET 2 is an n-channel type MOSFET, the MOSFET 2 can pull the output voltage Vout downwards, not being limited by the threshold voltage Vth2 and the drain-source voltage of the MOSFET 3, as shown in FIG. 2A when turns on. That ensures large dynamic range of the output voltage Vout.

It is desirable that a potential of the positive power supply line 10 is determined higher than that of the positive supply line 9. That makes it possible to pull the output voltage Vout up to near the potential of the positive power supply line 9, ensuring much larger dynamic range of the output voltage Vout. Commonality of the positive power supply lines 9 and 10, however, is also possible.

<1.3. Idling Operation>

Next, discussion will be presented on an operation at switching between the current source and the current sink (sink-source switching), i.e., an idling operation. The idling operation refers to an operation for carrying a small amount of current as an idling current from one to the other among the MOSFET 1 for current source and the MOSFET 2 for current sink in order to prevent the MOSFET 1 and the MOSFET 2 from simultaneously turning off at the sink-source switching. The idling operation suppresses a switching distortion and a crossover distortion. This idling operation corresponds to periods B and D in FIG. 2B.

A relation between the current Is1 and the input voltage Vin is obtained as:

$$Is1 = \frac{\beta}{2} \cdot \{R1 \cdot (Ib1 - Id3(Vin)) - Vth1\}^2 \quad (1)$$

Using a voltage dividing ratio K depending on the resistance elements 6 and 7, the current Id2 is obtained as:

$$Id2 = \frac{\beta}{2} \cdot (K \cdot Vin - Vth2)^2 \quad (2)$$

where 0<K<1.

Figure 3:
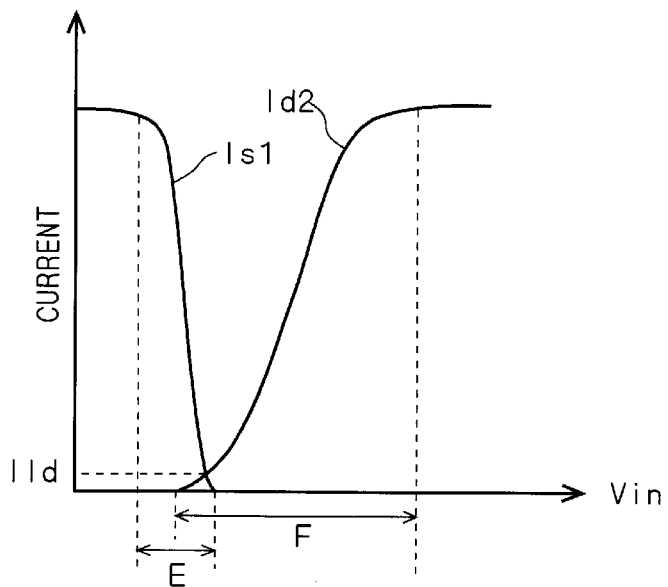

FIG. 3 is a graph showing the relation of Eq. 1 between the current Is1 and the input voltage Vin and the relation of Eq. 2 between the current Id2 and the input voltage Vin. Though a current flowing from the MOSFET 1 to the output terminal 12 contains a current flowing in the resistance element 5 as well s the current Is1, the current flowing in the resistance element 5 is negligible as compared with the current Is1. Therefore, the current Is1 of FIG. 3 substantially corresponds to the current flowing from the MOSFET 1 to the output terminal 12.

As shown in FIG. 3, the current Is1 decreases as the input voltage Vin rises in a range E of the input voltage Vin, and the current Id2 increases as the input voltage Vin rises in a range F of the input voltage Vin. In a region where the ranges E and F overlap, there is only one input voltage Vin allowing Is1=Id2. It is possible to control parameters such as the threshold voltages Vth1 to Vth3, the resistance R1, the voltage dividing ratio K and so on so that the input voltage Vin allowing Is1=Id2 may exist.

The current Is1 and the current Id2 when Is1=Id2 correspond to an idling current IId. The magnitude of the idling current IId, that is, the magnitudes of the currents Is1 and Id2 when Is1=Id2 can be set at a desired value in a wide range, using the above parameters. In short, the device 101 can achieve both larger dynamic range and easier control of the idling current IId.

<1.4. Desirable Condition>

Figure 4:
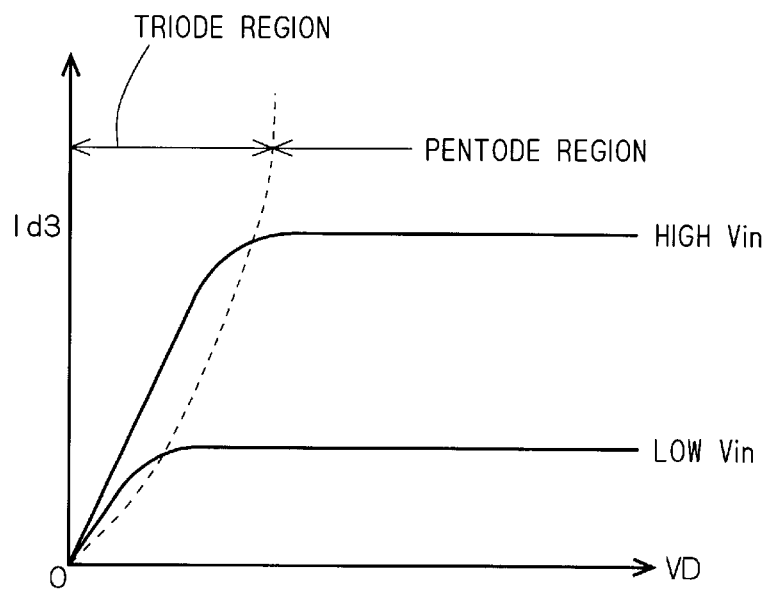

It is desirable to apply the reference voltage Va so that the MOSFET 3 may operate within a triode region (linear region). FIG. 4 is a graph schematically showing output characteristics of the MOSFET 3, i.e., a relation between a drain current Id3 of the MOSFET 3 and a drain-source voltage VD thereof. As shown in FIG. 4, an operation region of the MOSFET 3 has two regions, i.e., the triode region where the voltage VD is lower and the current Id3 increases as the voltage VD rises and the pentode region (saturation region) where the voltage VD is higher and the current Id3 hardly depends on the voltage VD.

When the operation of the MOSFET 3 is within the triode region, the drain current Id3 of the MOSFET 3 is obtained, using the drain-source voltage VD of the MOSFET 3, as:

$$Id3 = \beta \cdot \left\{(Vin - Vth3) \cdot VD - \frac{VD^2}{2}\right\} \quad (3)$$

The voltage VD is lower than the reference voltage Va by a base-emitter voltage (threshold voltage) Vbe. The base-emitter voltage Vbe hardly depends on the current Id3. Therefore, by keeping the reference voltage Va at a constant low value, the voltage VD can be kept at a constant low value, by which the MOSFET 3 operates within the triode region. That allows a linear relation between the current Id3 and the input voltage Vin as expressed by Eq. 3.

When a linear relation between the current Id3 and the input voltage Vin is held, from Eqs. 1 and 3, the current Is1 can be expressed as a quadric of the input voltage Vin. On the other hand, as indicated by Eq. 2, the relation between the current Id2 and the input voltage Vin is expressed as a quadric. In short, by keeping the reference voltage Va at a low value within a certain range, both the currents Is1 and Id2 can be expressed as a quadric of the input voltage Vin.

In other words, a transfer conductance between the input voltage Vin and the current Is1 (a ratio of the change in the output current to the change in the input voltage) and a transfer conductance between the input voltage Vin and the current Id2 can take approximate values, and it is thereby possible to enhance the symmetry between the current source operation and the current sink operation.

<1.5. Variations>

Though the MOSFETs 1, 2 and 3 are of n-channel type and the transistor 4 is of npn type in the device 101, a circuit complementary to the device 101 may be used. Specifically, a circuit may have a configuration in which the MOSFETs 1, 2 and 3 are of p-channel type, the transistor 4 is of pnp type and the potentials of the power supply lines are inverted. As well known, however, a p-channel type MOSFET, which uses a hole as carrier, has lower responsivity (i.e., response speed) than the n-channel type MOSFET which uses electrons as carrier.

The background-art device 150, which has both n-channel type MOSFETs and p-channel type MOSFETs, has a problem of limited responsivity inevitably caused by using the p-channel type MOSFETs. The device 101, in which all the MOSFETs are of n-channel type, has an advantage of excellent responsivity.

Figure 5:
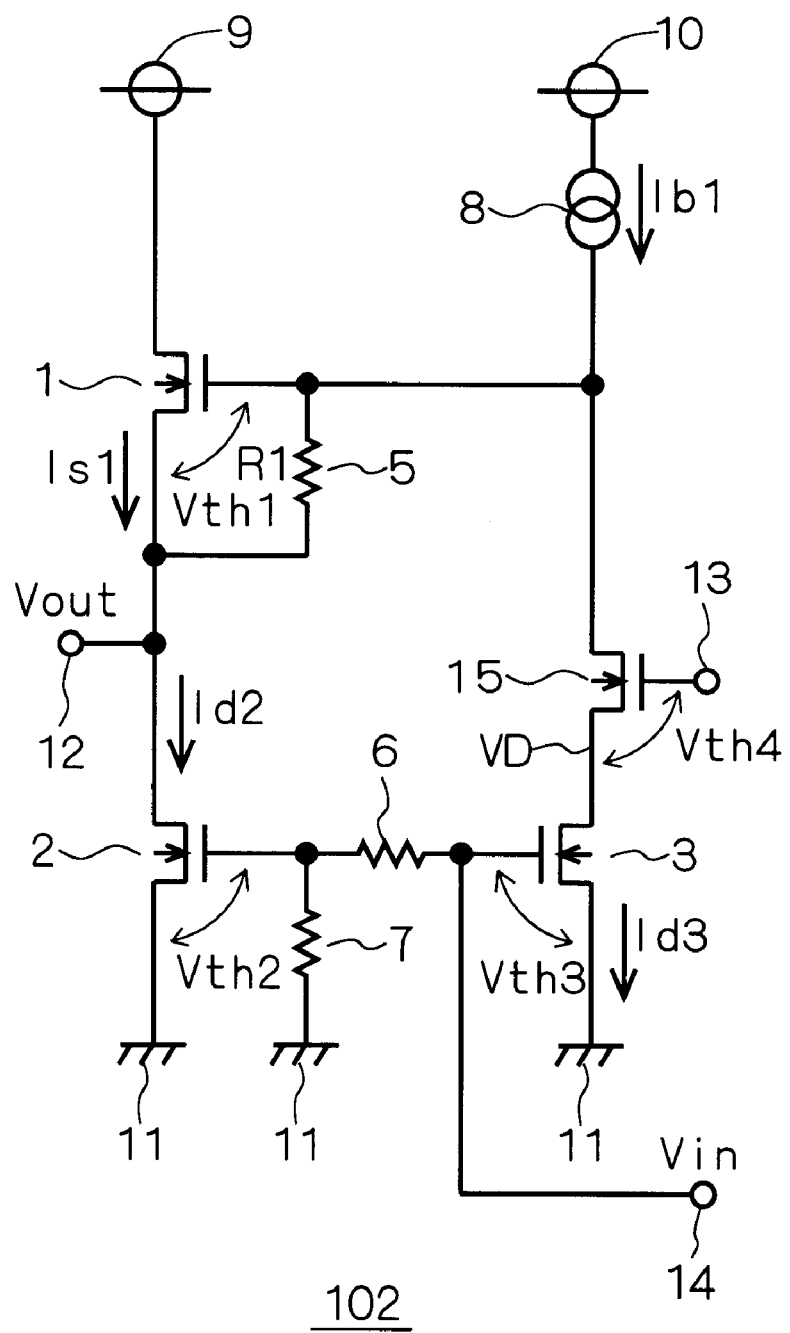
FIG. 5 is a circuit diagram showing another example of device in accordance with the first preferred embodiment.

As shown in FIG. 5, instead of the transistor 4, an n-channel type MOSFET 15 may be used. Also in this device 102 of FIG. 5, by applying a sufficiently-low voltage as the reference voltage Va, the MOSFET 3 can operate within the triode region. A threshold voltage Vth4 of the MOSFET 15 hardly depends on the current Id3, like the base-emitter voltage Vbe of the transistor 4.

The device 102, in which all the transistors are formed as MOSFETs, has an advantage of simpler process and lower cost of manufacture. On the other hand, since a manufacture error is easier to suppress in the base-emitter voltage Vbe than in the threshold voltage Vth of the MOSFET, the device 101 has an advantage of easily obtaining uniform characteristics of products.

Figure 6:
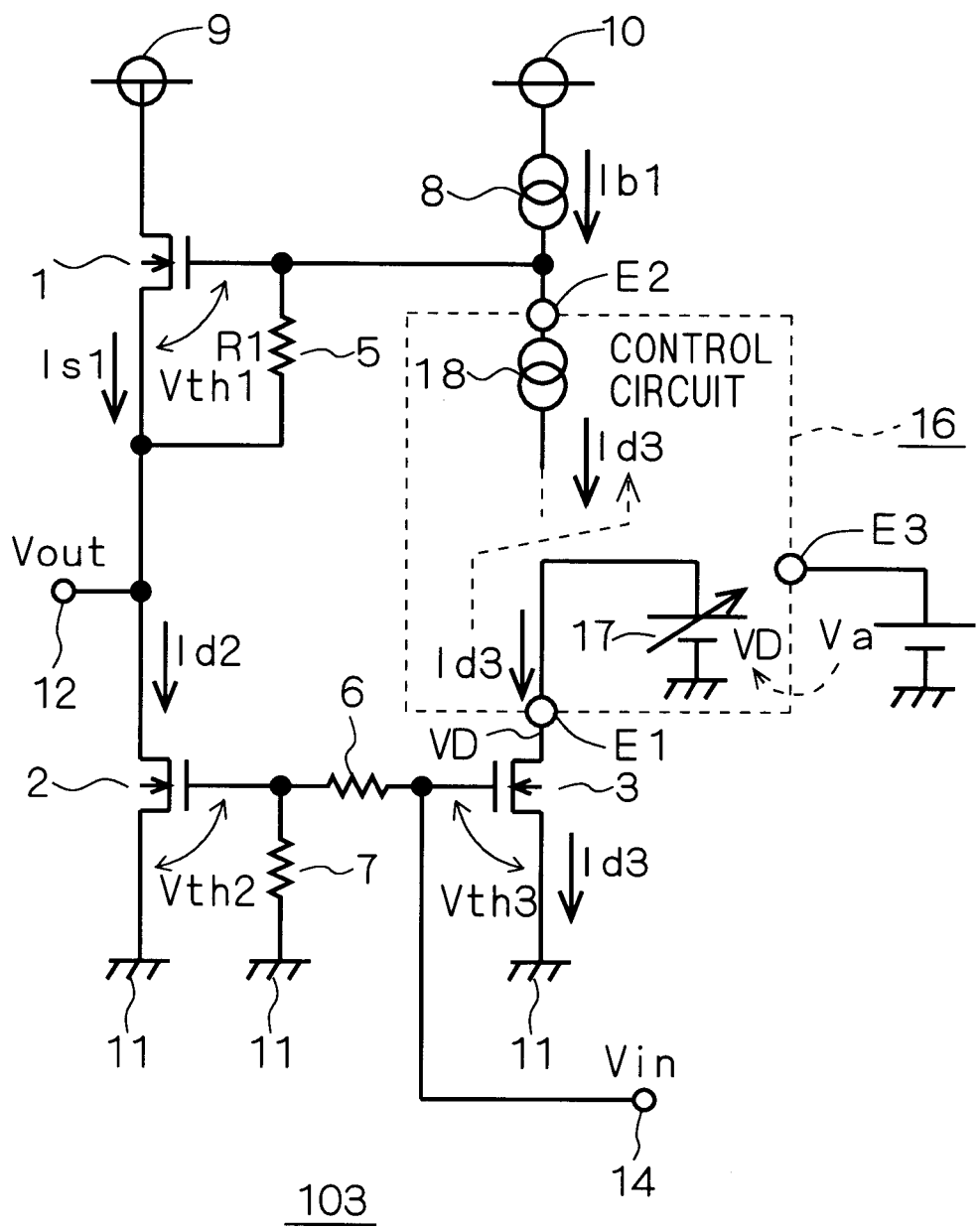
FIG. 6 is a circuit diagram showing a further example of device in accordance with the first preferred embodiment.

Further, as shown in a device 103 of FIG. 6, instead of the transistor 4 or the MOSFET 15, a control circuit 16 which performs a function equivalent to that of the transistor 4 or the MOSFET 15 may be generally used. A first electrode E1 of the control circuit 16 is connected to the drain electrode of the MOSFET 3 and a second electrode E2 is connected to the gate electrode of the MOSFET 1. A voltage source 17 keeps a voltage across the first electrode E1 and the ground power supply line 11 at a level depending on the reference voltage Va applied to a third electrode E3. A current source 18 carries a current proportional to (or equal to) the current Id3 flowing in the first electrode E1 into the second electrode E2. The transistor 4 and the MOSFET 15 correspond to the simplest examples of the control circuit 16.

Figure 7:
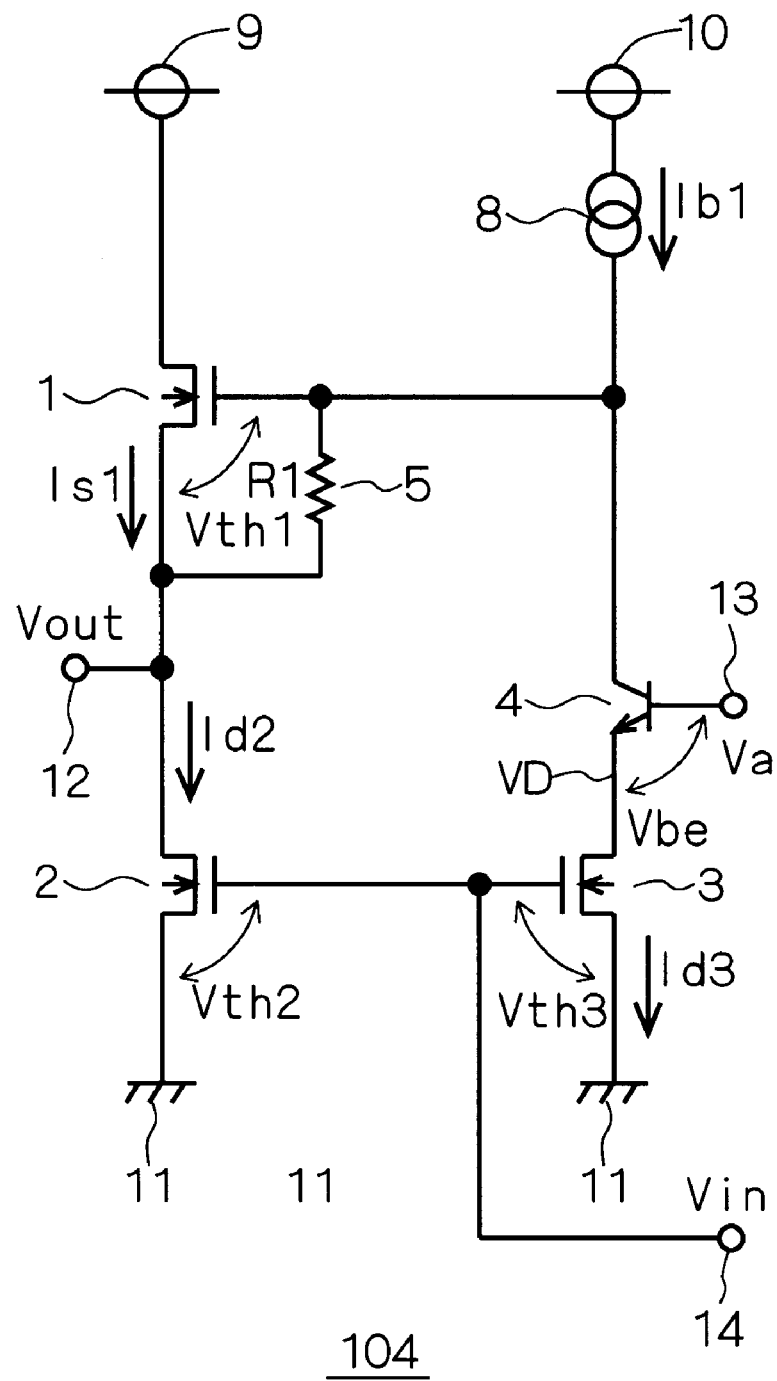
FIG. 7 is a circuit diagram showing still another example of device in accordance with the first preferred embodiment.

Furthermore, as shown in FIG. 7, omitting the resistance elements 6 and 7, the gate electrodes of the MOSFETs 2 and 3 may be directly connected. In this device 104 of FIG. 7, it is possible to obtain an idling current IId of desired magnitude by adjusting the parameters such as the threshold voltages Vth1, Vth2 and Vth3, resistance R1.

The device 104, having no resistance element connecting the input terminal 14 and the ground power supply line 11, has an advantage of high input impedance. On the other hand, the device 101, having the resistance elements 6 and 7, has an advantage of easier fine-tuning of the idling current IId by fine-tuning of the resistance elements 6 and 7 on the last stage of device manufacture.

<2. The Second Preferred Embodiment>

Figure 8:
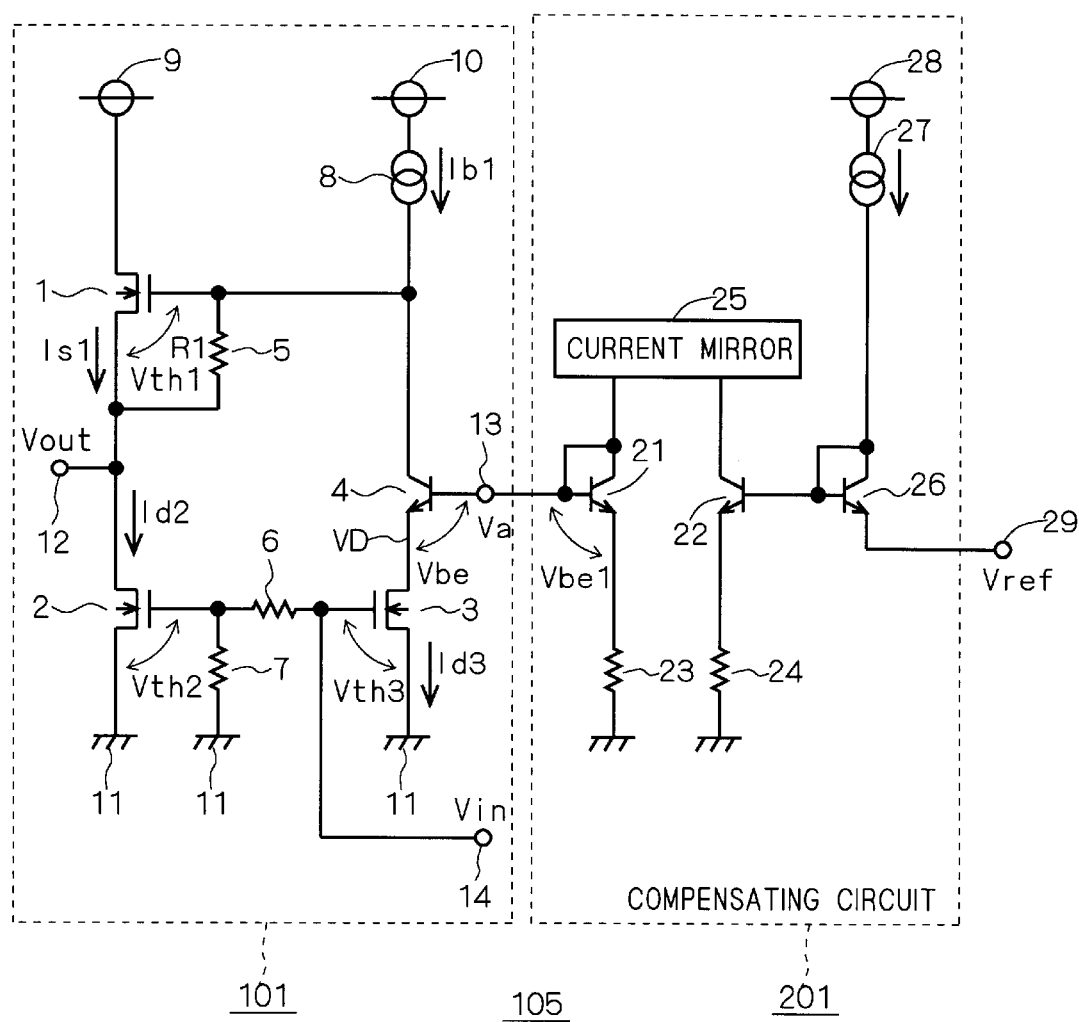
FIG. 8 is a circuit diagram of a device in accordance with a second preferred embodiment.

FIG. 8 is a circuit diagram showing a configuration of an amplifying device 105 in accordance with the second preferred embodiment. The device 105 is characteristically different from the device 101 (of FIG. 1) in further comprising a compensating circuit 201 for compensating the base-emitter voltage Vbe of the transistor 4 to stabilize the voltage VD. The compensating circuit 201 comprises transistors 21, 22 and 26, resistance elements 23 and 24, a current mirror circuit 25, an input terminal 29 and a constant current source 27.

The transistors 21, 22 and 26 are each an npn-type bipolar transistor. The transistor 21 is paired with the transistor 4 and the transistors 22 and 26 are paired with each other. The resistance elements 23 and 24 are paired with each other. "Being paired" among a plurality of elements of the same kind refers to that the elements have the same characteristics, such as manufacture error and variation with temperature change (temperature characteristics). It is possible to achieve pairing by incorporating these elements in close portions to each other in a semiconductor substrate.

A base electrode of the transistor 21 is connected to a base electrode of the transistor 4. A collector electrode and the base electrode of the transistor 21 are connected to each other, and further connected to the current mirror circuit 25. An emitter electrode of the transistor 21 is connected to the ground power supply line 11 through the resistance element 23. A collector electrode of the transistor 22 is connected to the current mirror circuit 25 and an emitter electrode of the transistor 22 is connected to the ground power supply line 11 through the resistance element 24.

A base electrode of the transistor 26 is connected to a base electrode of the transistor 22. A collector electrode and the base electrode of the transistor 26 are connected to each other, and further connected to an output end of the constant current source 27. An emitter electrode of the transistor 26 is connected to the input terminal 29. The constant current source 27 is also connected to a positive power supply line 28, outputting a constant current by its output end. Common use of the positive power supply line 10 as the positive power supply line 28 is possible. A reference voltage Vref of constant level is inputted to the input terminal 29.

The reference voltage Vref applied to the input terminal 29 is reflected on a potential of the emitter electrode of the transistor 22. The potential is further reflected on a potential of the emitter electrode of the transistor 21 through the current mirror circuit 25. Therefore, the base-emitter voltage Vbe of the transistor 4 is compensated by a base-emitter voltage Vbe1 of the transistor 21.

In other words, even when the base-emitter voltage Vbe of the transistor 4 varies due to temperature change and the like, the variation is compensated by the base-emitter voltage Vbe1 which varies similarly, producing no effect on the voltage VD. In short, the effect due to the temperature change and the like is suppressed to keep the voltage VD at a value depending on the reference voltage Vref in a stable manner.

Figure 9:
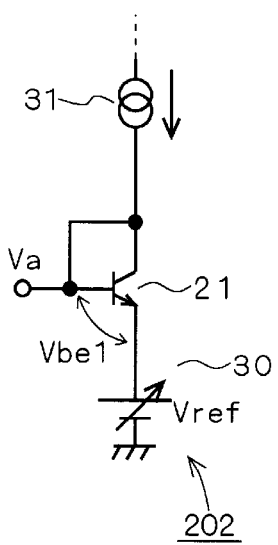
FIG. 9 is a circuit diagram showing another example of device in accordance with the second preferred embodiment.

As a compensating circuit for suppressing the effect due to the variation in the base-emitter voltage Vbe, besides the exemplary compensating circuit 201, circuits of various configurations generally known as "level shift circuit" may be adopted. FIG. 9 is a circuit diagram showing a general configuration of a compensating circuit. The compensating circuit 202 comprises a constant voltage circuit 30, the transistor 21 and a constant current source 31. The transistor 21 is paired with the transistor 4 and has the same conductivity type as the transistor 4.

The constant voltage circuit 30 outputs a constant voltage with respect to the ground power supply line 11 to its output end. The emitter electrode of the transistor 21 is connected to the output end of the constant voltage circuit 30 and the base electrode thereof is connected to the base electrode of the transistor 4. The collector electrode of the transistor 21 is connected to the base electrode of the transistor 21 and an output end of the constant current source 31. The voltage VD is, therefore, kept at the constant voltage Vref outputted by the constant voltage circuit 30.

<3. The Third Preferred Embodiment>

Figure 10:
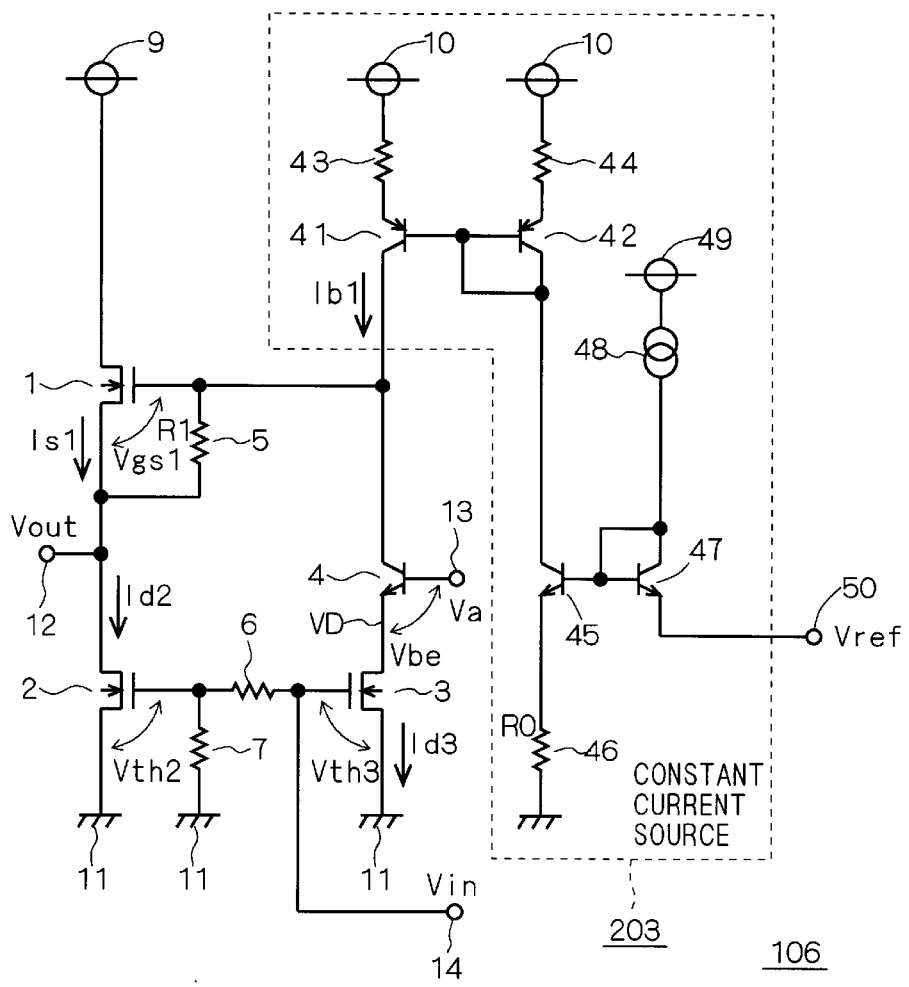
FIG. 10 is a circuit diagram of a device in accordance with a third preferred embodiment.

FIG. 10 is a circuit diagram showing a configuration of an amplifying device 106 in accordance with the third preferred embodiment. The device 106 is characteristically different from the device 101 (of FIG. 1) in having a configuration where the constant current source 8 compensates variation in the resistance R1 of the resistance element 5 to stabilize a gate-source voltage of the MOSFET 1. A constant current source 203, which is substituted for the constant current source 8, comprises transistors 41, 42, 45 and 47, resistance elements 43, 44 and 46, a constant current source 48 and an input terminal 50.

The transistors 41 and 42 are each a pnp-type bipolar transistor, and paired with each other. The resistance elements 43 and 44 are paired with each other. The transistors 45 and 47 are each an npn-type bipolar transistor, and paired with each other. The resistance element 46 is paired with the transistor 5.

A collector electrode of the transistor 41 is connected, as an output end of the constant current source 203, to the collector electrode of the transistor 4. An emitter electrode of the transistor 41 is connected to the positive power supply line 10 through the resistance element 43. A base electrode of the transistor 41 is connected to a base electrode of the transistor 42. An emitter electrode of the transistor 42 is connected to the positive power supply line 10 through the resistance element 44. The base electrode and a collector electrode of the transistor 42 are connected to each other and further connected to a collector electrode of the transistor 45.

An emitter electrode of the transistor 45 is connected to the ground power supply line 11 through the resistance element 46. A base electrode of the transistor 45 is connected to a base electrode of the transistor 47. A collector electrode and the base electrode of the transistor 47 are connected to each other, and further connected to an output end of the constant current source 48. An emitter electrode of the transistor 47 is connected to the input terminal 50. The reference voltage Vref of constant level is inputted to the input terminal 50. The constant current source 48 is also connected to a positive power supply line 49, outputting a constant current by its output end. Common use of the positive power supply line 10 as the positive power supply line 49 is possible.

The reference voltage Vref applied to the input terminal 50 is reflected on a potential of the emitter electrode of the transistor 45. As a result, a current having a magnitude of Vref/R0 flows in the resistance element 46 having a resistance R0. Therefore, assuming that a current gain of a current mirror circuit having the transistors 41 and 42 and the resistance elements 43 and 44 is 1, the current Ib1 having a magnitude of Ib1=Vref/R0 is outputted from the constant current source 203.

When the whole current Ib1 flows in the resistance element 5, a gate-source voltage Vgs1 is (R1/R0)·Vref.

Since the resistance elements 5 and 46 are paired with each other, the ratio R1/R0 of resistances is constant, not depending on temperature and the like. Therefore, the gate-source voltage Vgs1 is kept constant, suppressing the effect of temperature change and the like in the resistance element 5.

When the idling current IId flows in the MOSFETs 1 and 2, the whole current Ib1 do not flow into the resistance element 5 but part of the current Ib1 at a constant ratio flows therein. According to the ratio, the effect on the idling current IId due to variation in the resistance R1 can be suppressed.

Figure 11:
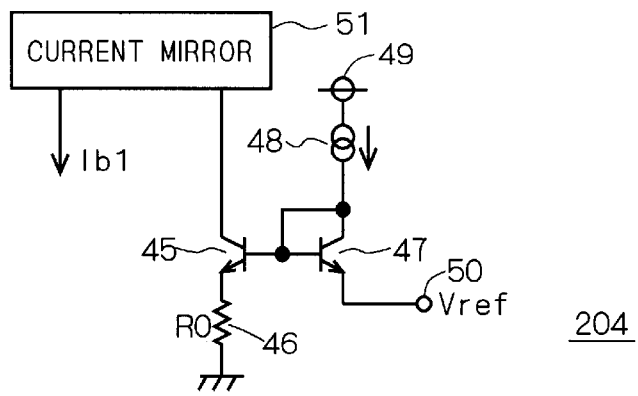
FIG. 11 is a circuit diagram showing another example of device in accordance with the third preferred embodiment.
Figure 12:
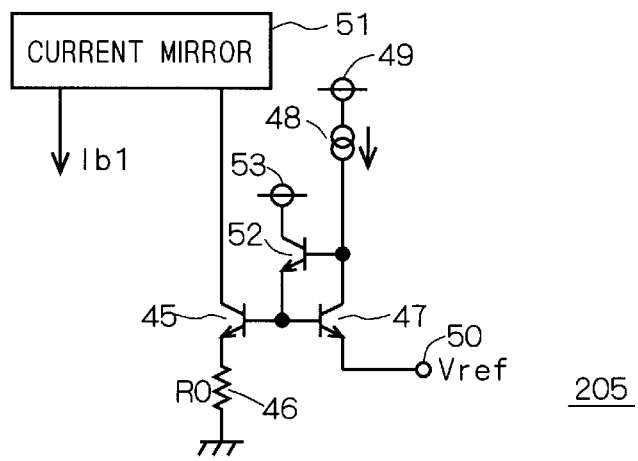
FIG. 12 is a circuit diagram showing a further example of device in accordance with the third preferred embodiment.
Figure 13:
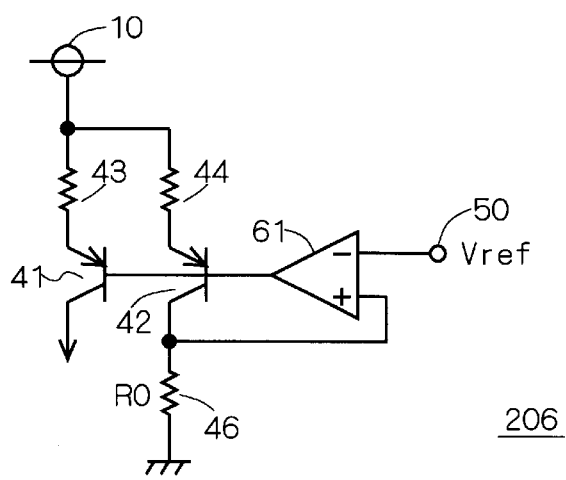
FIG. 13 is a circuit diagram showing an yet example of device in accordance with the third preferred embodiment.

As a constant current source for suppressing the effect due to the variation in the resistance R1, besides the exemplary constant current source 203 of FIG. 10, various configurations may be adopted. FIGS. 11 to 13 are circuit diagrams showing such configuration examples. In a constant current source 204 of FIG. 11, the transistors 41 and 42 and the resistance elements 43 and 44 are replaced by a general-type current mirror circuit 51.

In a constant current source 205 of FIG. 12, a transistor 52 is additionally provided in the constant current source 204 (of FIG. 11). The transistor 52 is an npn-type bipolar transistor, and a base electrode and an emitter electrode thereof are connected to the collector electrode and the base electrode of the transistor 47, respectively. A collector electrode of the transistor 52 is connected to a positive power supply line 53. Common use of the positive power supply line 49 as the positive power supply line 53 is possible.

In a constant current source 206 of FIG. 13, the transistor 47 and the constant current source 48 of the constant current source 203 (of FIG. 10) are replaced by an amplifier 61. The input terminal 50 is connected to a reverse input of the amplifier 61 and the collector electrode of the transistor 42 is connected to a non-reverse input thereof, forming a negative feedback loop. Hence, the reference voltage Vref applied to the input terminal 50 is reflected on a potential of the collector electrode of the transistor 42. As a result, a current having a magnitude of Vref/R0 flows into the resistance element 46.

Figure 14:
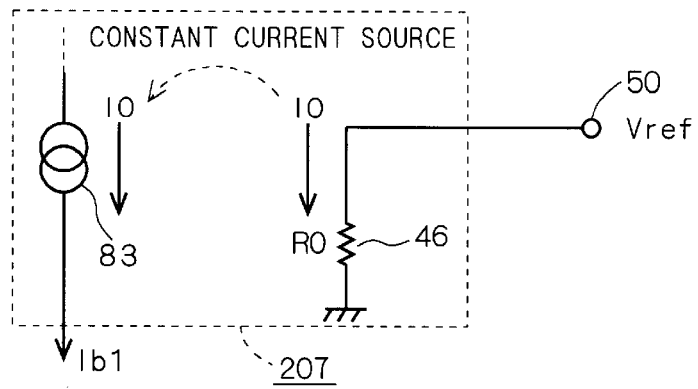
FIG. 14 is a circuit diagram showing still another example of device in accordance with the third preferred embodiment.

FIG. 14 is a circuit diagram showing a general configuration of a constant current source for compensating variation in the resistance R1, including the constant current sources shown in FIGS. 10 to 13. The constant current source 207 comprises the resistance element 46 paired with the resistance element 5 and a current source 83. The reference voltage Vref is applied to one end of the resistance element 46 through the input terminal 50. The current source 83 outputs a current proportional to (or equal to) a current I0 flowing in the resistance element 46 as the current Ib1. Therefore, when the whole current Ib1 flows into the resistance element 5, the gate-source voltage Vgs1 is in proportion to (R1/R0)·Vref.

<4. The Fourth Preferred Embodiment>

Figure 15:
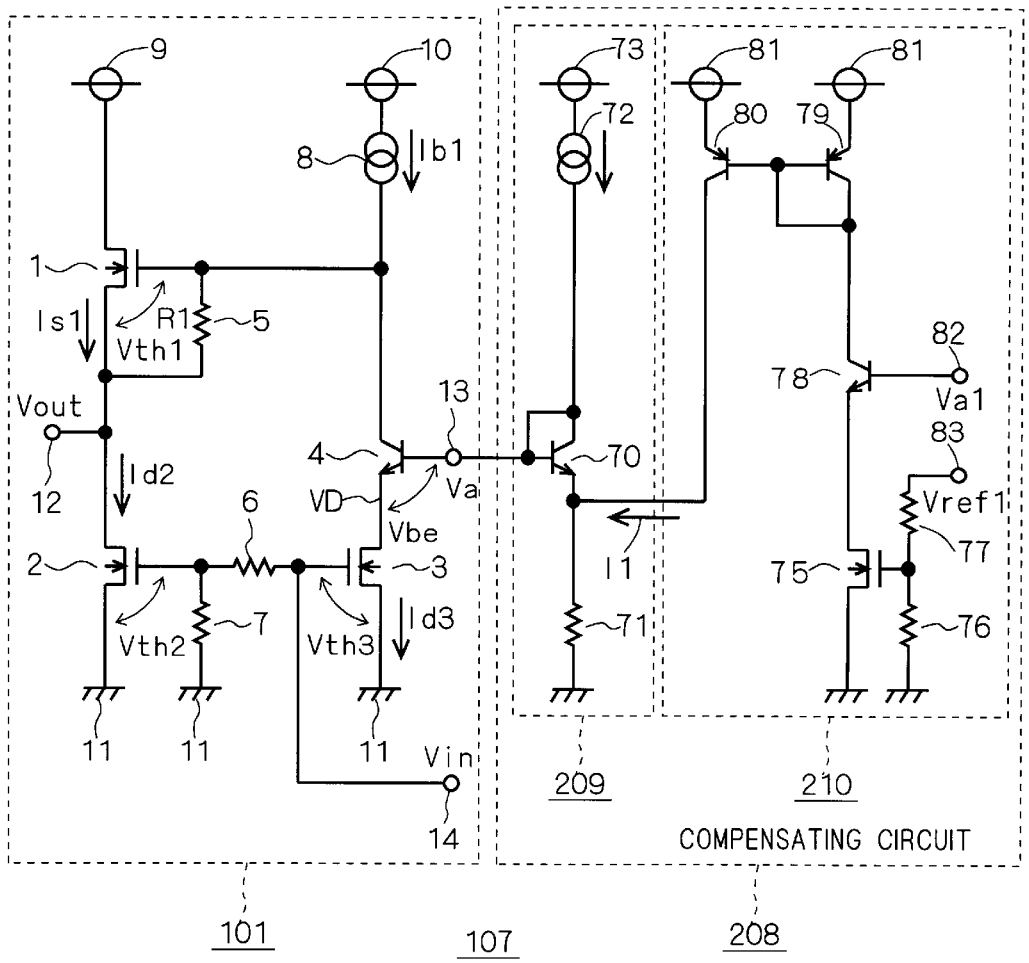
FIG. 15 is a circuit diagram of a device in accordance with a fourth preferred embodiment.

FIG. 15 is a circuit diagram showing a configuration of an amplifying device 107 in accordance with the fourth preferred embodiment. The device 107 is characteristically different from the device 101 (of FIG. 1) in comprising a compensating circuit 208 for compensating the threshold voltages of the MOSFETs 1, 2 and 3 to stabilize the idling current IId. The compensating circuit 208 comprises bipolar-type transistors 70, 78, 79 and 80, an n-channel type MOSFET 75, resistance elements 71, 76 and 77, a constant current source 72 and input terminals 82 and 83.

In the device 107, the MOSFETs 1, 2 and 3 of the device 101 and the MOSFET 75 of the compensating circuit 208 are paired with one another. The transistors 70 and 78 are of npn type, and the transistors 79 and 80 are of pnp type, paired with each other.

A base electrode of the transistor 70 is connected to the base electrode of the transistor 4 through the input terminal 13. An emitter electrode of the transistor 70 is connected to the ground power supply line 11 through the resistance element 71. A collector electrode and the base electrode of the transistor 70 are connected to each other, and further connected to an output end of the constant current source 72. The constant current source 72 is also connected to a positive power supply line 73, outputting a constant current by its output end.

A collector electrode of the transistor 80 is connected to the emitter electrode of the transistor 70. The emitter electrodes of the transistors 80 and 79 are connected to a positive power supply line 81. Further, a base electrode and a collector electrode of the transistor 79 are connected to each other, and connected to a base electrode of the transistor 80 and a collector electrode of the transistor 78.

An emitter electrode of the transistor 78 is connected to a drain electrode of the MOSFET 75. The input terminal 82 is connected to a base electrode of the transistor 78. A source electrode of the MOSFET 75 is connected to the ground power supply line 11. A gate electrode of the MOSFET 75 is connected to a node between the resistance elements 76 and 77 connected in series. The other end of the resistance element 77 is connected to the input terminal 83, and the other end of the resistance element 76 is connected to the ground power supply line 11. A constant reference voltage Va1 is inputted to the input terminal 82 and another constant reference voltage Vref1 is inputted to the input terminal 83.

In the device 101 of FIG. 1 having no compensating circuit 210, the idling current IId varies as the threshold voltages of the MOSFET 1, 2 and 3 vary due to temperature change and the like. For example, when the threshold voltages become low, the idling current IId increases. The compensating circuit 210 suppresses the effect on the idling current IId due to the variation in the threshold voltages.

Eqs. 1 and 3 show that the idling current IId decreases as the drain current Id3 of the MOSFET 3 increases. The compensating circuit 210, utilizing this relation, works to increase the current Id3 as the threshold voltages drop. For example, when the threshold voltages of the MOSFETs 1, 2 and 3 drop, the threshold voltage of the MOSFET 75 also drops. Since a constant voltage obtained by dividing the reference voltage Vref1 by the two resistance elements 76 and 77 is applied to the gate electrode of the MOSFET 75, a drain current flowing in the MOSFET 75 increases.

As a result, through a current mirror circuit having the transistors 79 and 80, a collector current I1 flowing in the transistor 80 increases. Since a current flowing in the resistance element 71 increases when the current I1 increases, a potential of the emitter electrode of the transistor 70 rises. Consequently, the voltage VD rises. The rise of the voltage VD causes an increase in the current Id3, as shown in Eq. 3. Therefore, the idling current IId decreases.

On the other hand, when the threshold voltages of the MOSFETs rise, the voltage VD drops and the current Id3 decreases. Thus, the effect due to the variation in the threshold voltage can be suppressed and the idling current IId is stabilized.

In the compensating circuit 208, a circuit portion 209 is configured like the compensating circuit 202 of the second preferred embodiment. Therefore, the compensating circuit 208 also produces the effect of compensating the base-emitter voltage Vbe of the transistor 4 like the second preferred embodiment.

As the reference voltage Va1 desirable is such a voltage as the MOSFET 75 may operate within the triode region. In this case, the variation in the threshold voltage of the MOSFET 75 is reflected on the variation in the voltage VD of the MOSFET 3 with a linear relation. As shown in Eq. 3, since the current id3 has a linear relation with respect to both the threshold voltage Vth3 and the voltage VD of the MOSFET 3 in primary approximation, the effect due to the threshold voltage can be more effectively diluted when the voltage VD has a linear relation with the threshold voltage of the MOSFET 75.

As a compensating circuit for suppressing the effect due to the variation in the threshold voltage, besides the exemplary compensating circuit 208 of FIG. 15, various configurations may be adopted. As an example, the circuit portion 210 of the compensating circuit 210 can be replaced with the a circuit portion 211 of FIG. 16. The circuit portion 211 comprises the MOSFET 75, the input terminal 82 and a current mirror circuit 86.

The gate electrode of the MOSFET 75 is connected to the input terminal 82 to which the reference voltage Vref1 is applied. The source electrode of the MOSFET 75 is connected to the ground power supply line 11 and the drain electrode thereof is connected to the current mirror circuit 86. An output current of the current mirror circuit 86 is supplied for the resistance element 71 (of FIG. 15) as the current I1. In the circuit portion 211, like in the circuit portion 210 of FIG. 15, the current I1 increases when the threshold voltage of the MOSFET 75 drops.

Figure 17:
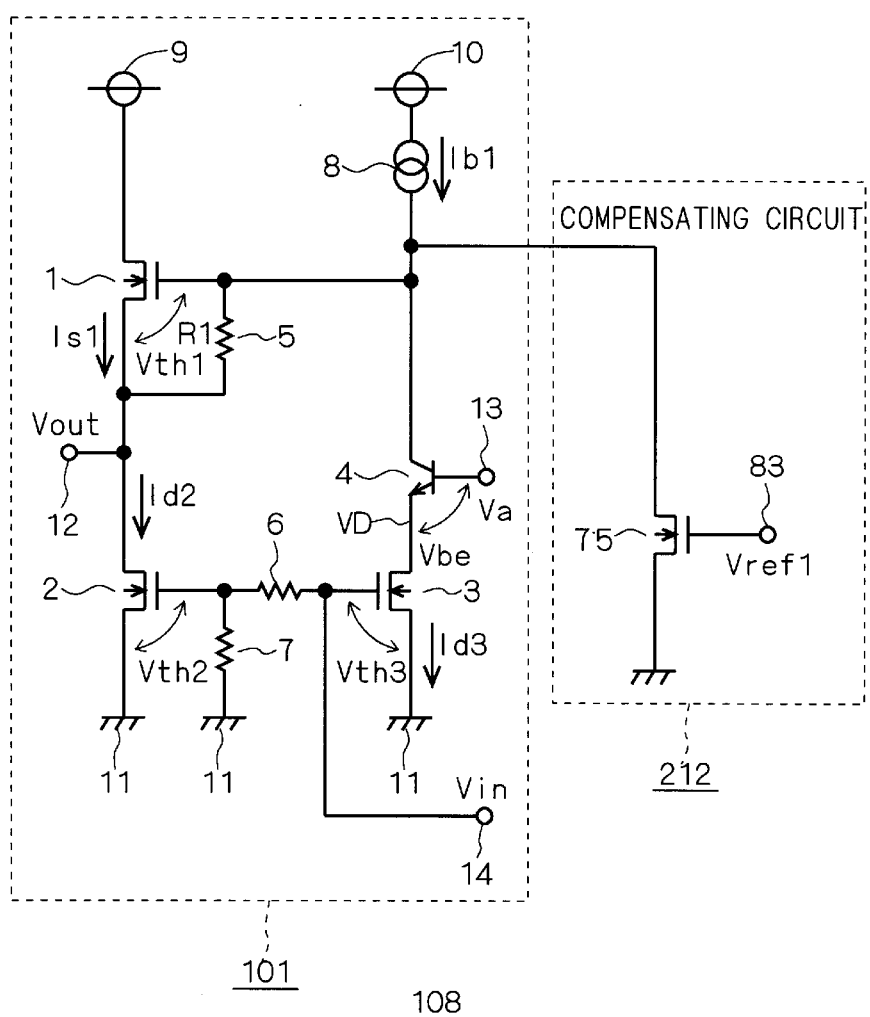
FIG. 17 is a circuit diagram showing a further example of device in accordance with the fourth preferred embodiment.

FIG. 17 is a circuit diagram showing a further example of a compensating circuit for suppressing the effect due to the variation in the threshold voltage. The compensating circuit 212 of FIG. 17 comprises the MOSFET 75 and the input terminal 82 connected to the gate electrode of the MOSFET 75. The source electrode of the MOSFET 75 is connected to the ground power supply line 11 and the drain electrode thereof is connected to the collector electrode of the transistor 4. The constant reference voltage Vref1 is applied to the input terminal 83.

When the threshold voltage of the MOSFET 75 drops, the drain current thereof increases. Hence, a component of the current Ib1 separately flowing into the MOSFET 75 increases. As a result, since a component of the current Ib1 flowing into the resistance element 5 decreases, the idling current decreases. In other words, the compensating circuit 212 reduces the current flowing into the resistance element 5 by reducing the current Ib1 while the compensating circuit 208 (of FIG. 15) reduces the current flowing into the resistance element 5 to reduce the idling current IId by increasing the current Id3. The two compensating circuits reflect the variation in the threshold voltage of the MOSFET 75 on the variation in the current flowing into the resistance element 5 in common.

Figure 16:
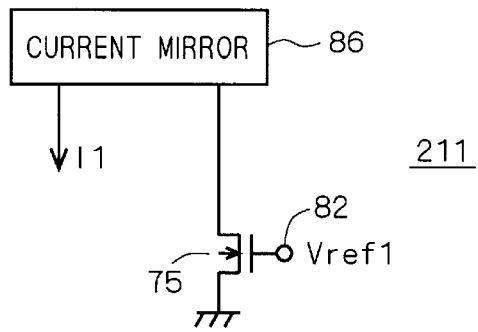
FIG. 16 is a circuit diagram showing another example of device in accordance with the fourth preferred embodiment.
Figure 18:
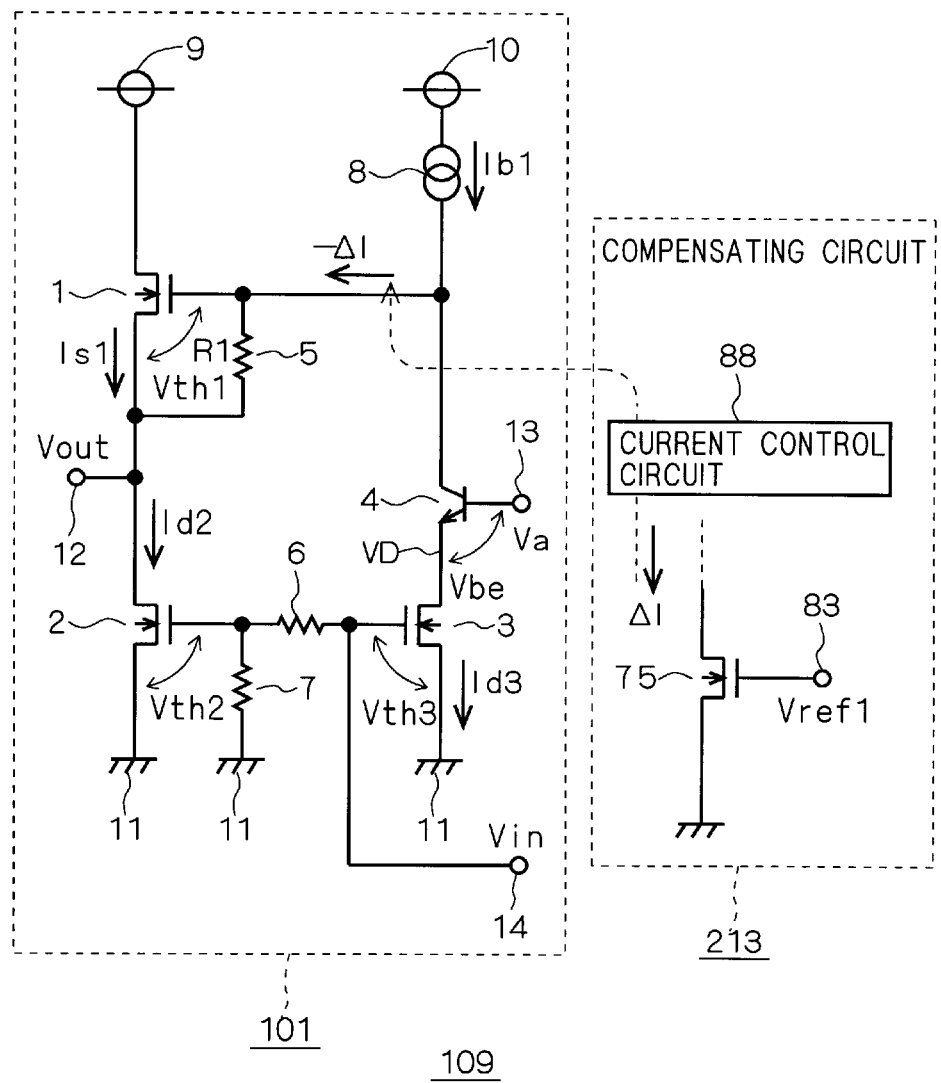
FIG. 18 is a circuit diagram showing still another example of device in accordance with the fourth preferred embodiment.

FIG. 18 is a circuit diagram showing a general configuration of a compensating circuit for compensating the variation in the threshold voltage of the MOSFETs 1, 2 and 3, including the compensating circuits shown in FIGS. 15 to 17. The compensating circuit 213 comprises the MOSFET 75, the input terminal 83 and a superimposing (current control) circuit 88. The MOSFET 75 is paired with the MOSFETs 1, 2 and 3 and has the same channel type (conductivity type) as the MOSFETs 1, 2 and 3.

The source electrode of the MOSFET 75 is connected to the ground power supply line 11 and the gate electrode thereof is connected to the input terminal 83. The constant reference voltage Vref1 is applied to the input terminal 83. The current control circuit 88 dilutes the current flowing in the resistance element 5 with a current proportional to (or equal to) the change ΔI in the drain current of the MOSFET 75. When the threshold voltage of the MOSFET 75 drops, the change ΔI increases. With this, the current flowing in the resistance element 5 decrease.

<5. The Fifth Preferred Embodiment>

Figure 19:
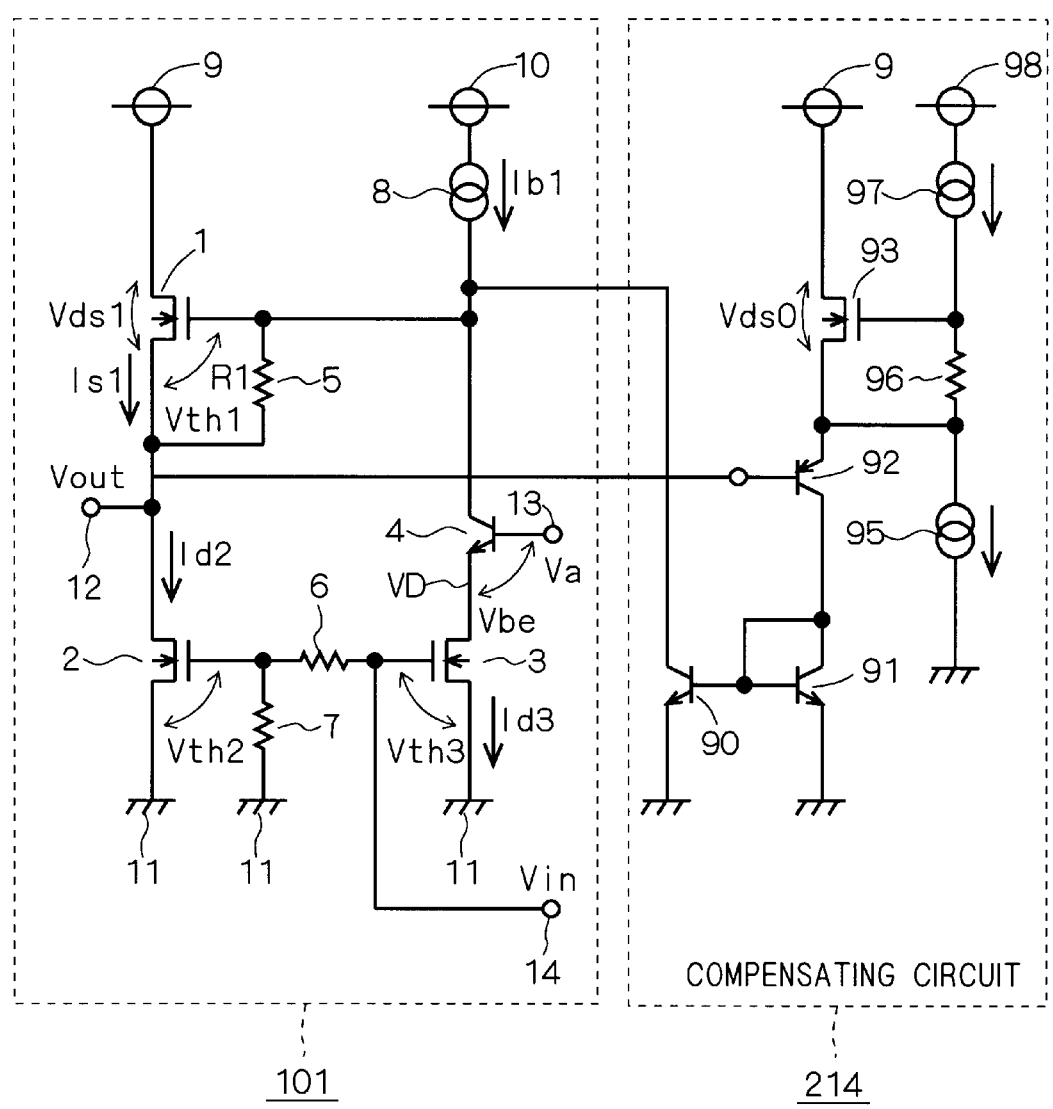
FIG. 19 is a circuit diagram of a device in accordance with a fifth preferred embodiment.

FIG. 19 is a circuit diagram showing a configuration of an amplifying device 110 in accordance with the fifth preferred embodiment. The device 110 is characteristically different from the device 101 (of FIG. 1) in further comprising a compensating circuit 214 for compensating dependency of the drain current on the drain-source voltage of the MOSFET 1 to suppress the dependency of the idling current IId on the output voltage Vout.

In the device 101 of FIG. 1, without the compensating circuit 214, the idling current IId varies depending on the output voltage Vout. This phenomenon is caused by the dependency of the drain current on the drain-source voltage in the pentode region, that is, variation of the coefficient β of Eq. 3 depending on variation in a drain-source voltage Vds1 of the MOSFET 1.

For example, when the output voltage Vout rises, the drain-source voltage Vds1 drops, and at this time, the coefficient β decreases because of the dependency of the drain current on the drain-source voltage. As a result, as is clear from Eq. 1, the idling current IId decreases. When the output voltage Vout drops, the idling current IId increases. The variation in the idling current IId due to the dependency of the drain current on the drain-source voltage is especially pronounced when the device 101 is used under the condition of almost no load.

The compensating circuit 214 comprises bipolar-type transistors 90, 91 and 92, an n-channel type MOSFET 93, a resistance element 96 and constant current sources 95 and 97. The transistors 90 and 91 are of npn type and the transistor 92 is of pnp type. The MOSFET 93 is paired with the MOSFET 1, and the resistance element 96 is paired with the resistance element 5. Both the constant current sources 95 and 97 are paired with the constant current source 8.

Emitter electrodes of the transistors 90 and 91 are connected to the ground power supply line 11 and base electrodes thereof are connected to each other. A collector electrode of the transistor 90 is connected to the collector electrode of the transistor 4. The base electrode and a collector electrode of the transistor 91 are connected to each other, and connected to a collector electrode of the transistor 92. A base electrode of the transistor 92 is connected to a node between the source electrode of the MOSFET 1 and the drain electrode of the MOSFET 2. Further, an emitter electrode of the transistor 92 is connected to a source electrode of the MOSFET 93.

A drain electrode of the MOSFET 93 is connected to the positive power supply line 9. One end of the resistance element 96 is connected to a gate electrode of the MOSFET 93 and an output end of the constant current source 97, and the other end of the resistance element 96 is connected to the source electrode of the MOSFET 93 and an output end of the constant current source 95. The constant current source 97 is also connected to the positive power supply line 98, outputting a constant (positive) current to its output end. Similarly, the constant current source 95 is also connected to the ground power supply line 11, outputting a constant (negative) current of the same magnitude as that of the constant current source 97 to its output end. It is desirable to commonly use the positive power supply line 10 as the positive power supply line 98.

A constant current is supplied for the resistance element 96 by the constant current sources 95 and 97. When the output voltage Vout rises, the rise is reflected on a potential of the source electrode of the MOSFET 93 through the transistor 92. In other words, the transistor 92 works as a feedback circuit. When the potential of the source electrode of the MOSFET 93 rises, a drain-source voltage Vds0 of the MOSFET 93 drops. With this, the coefficient β of the MOSFET 93 decreases due to the dependency of the drain current on the drain-source voltage.

As a result, the drain current of the MOSFET 93 decreases. Through a current mirror circuit having the transistors 90 and 91, a collector current proportional to the drain current of the MOSFET 93 flows in the transistor 90. The collector current of the transistor 90 is a component divided from the current Ib1 supplied by the constant current source 8. Therefore, when the drain current of the MOSFET 93 decreases, the component separately flowing into the resistance element 5 increases out of the current Ib1 supplied by the constant current source 8.

As a result, the gate-source voltage Vgs1 of the MOSFET 1 rises. The rise of the gate-source voltage Vgs1 increases the current Is1 flowing in the MOSFET 1 and thereby dilutes a decrease in the current Is1 due to a decrease in the coefficient β. When the output voltage Vout drops, an increase in the current Is1 due to an increase in the coefficient β is diluted. The compensating circuit 214, operating as above, compensates the dependency of the drain current on the drain-source voltage of the MOSFET 1 and achieves a stable idling current IId.

As a compensating circuit for suppressing the effect due to the dependency of the drain current on the drain-source voltage, besides the exemplary compensating circuit 214 of FIG. 19, various configurations may be adopted. FIG. 20 shows such an example. In a compensating circuit 215 of FIG. 20, the transistors 90 and 91 of the compensating circuit 214 (of FIG. 19) are replaced with the circuit portion 209 of FIG. 15. The collector electrode of the transistor 92 is connected to the emitter electrode of the transistor 70.

In the compensating circuit 215, since the variation in the drain current is propagated to the voltage VD, the collector current of the transistor 4 also varies. Hence, when the drain current of the MOSFET 93 decreases, an extra current proportional to a decrease in the current flows into the resistance element 5. Therefore, the compensating circuit 215 suppresses the effect due to the dependency of the drain current on the drain-source voltage of the MOSFET 1 to stabilize the idling current IId, like the compensating circuit 214.

Figure 21:
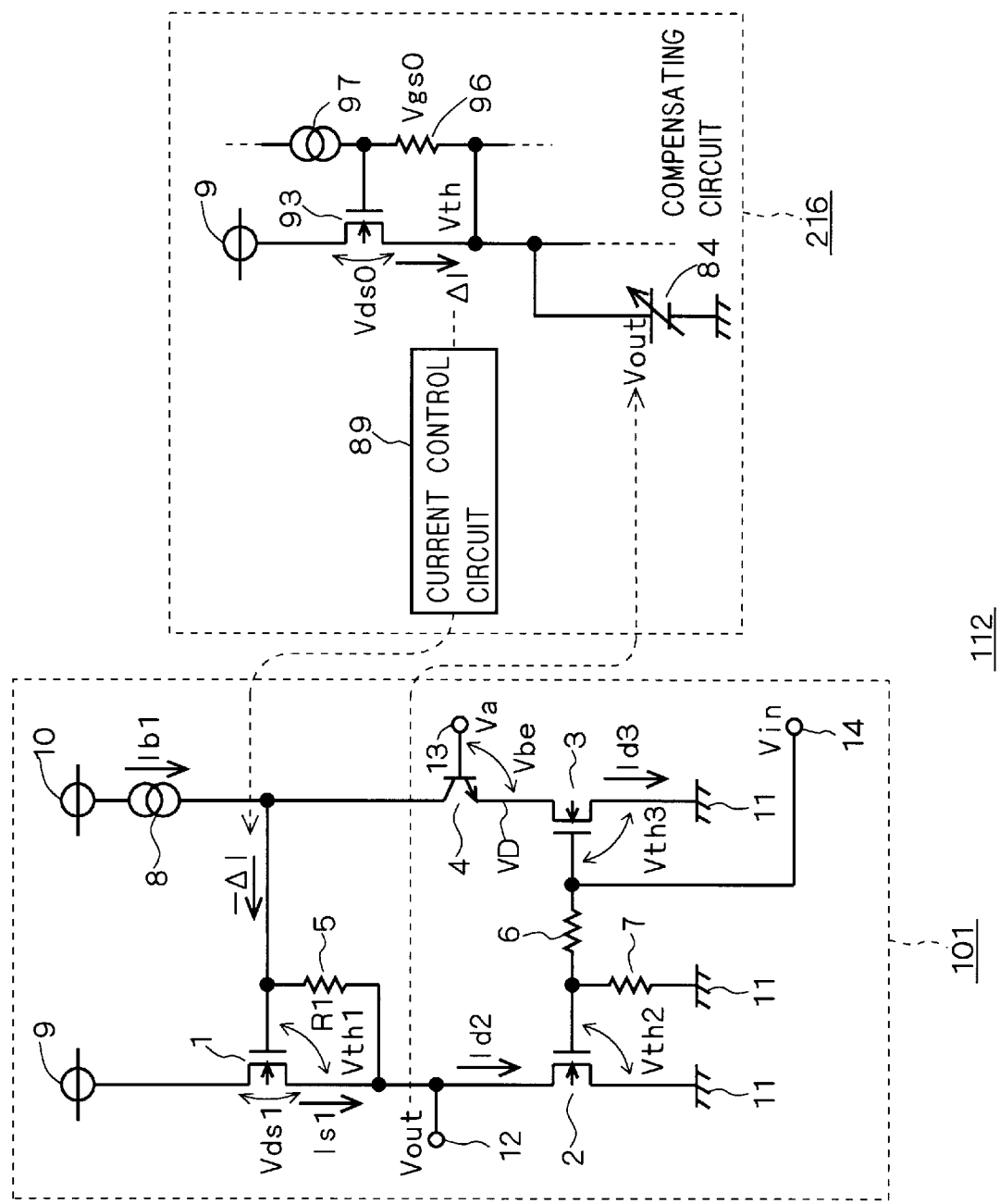
FIG. 21 is a circuit diagram showing still another example of device in accordance with the fifth preferred embodiment.

FIG. 21 is a circuit diagram showing a general configuration of a compensating circuit for compensating the dependency of the drain current on the drain-source voltage of the MOSFET 1, including the compensating circuits shown in FIGS. 19 and 20. The compensating circuit 216 comprises the MOSFET 93, the resistance element 96, the constant current source 97, a feedback circuit 84 and a current control circuit 89. The MOSFET 93 is paired with the MOSFET 1 and has the same channel type as the MOSFET 1, as discussed earlier. The resistance element 96 is paired with the resistance element 5.

The drain electrode of the MOSFET 93 is connected to the positive power supply line 9, and the gate electrode and the source electrode thereof are connected to one end and the other end of the resistance element 96, respectively. The constant current source, of which the output end is connected to the one end of the resistance element 96, supplies a constant current for the resistance element 96. The feedback circuit 84 detects the output voltage Vout and applies a voltage of the same level as the output voltage Vout to the source electrode of the MOSFET 93. The current control circuit 89 dilutes the current flowing in the resistance element 5 with a current proportional to (or equal to) the drain current of the MOSFET 3.

For example, when the output voltage Vout rises, the drain-source voltage Vds0 of the MOSFET 93 drops and due to the dependency of the drain current on the drain-source voltage, the drain current of the MOSFET 93 decreases. Then, the current flowing in the resistance element 5 increases. Therefore, the compensating circuit 216 suppresses the effect due to the dependency of the drain current on the drain-source voltage of the MOSFET 1 to stabilize the idling current Iid, like the compensating circuit 214 and so on.

<6. The Sixth Preferred Embodiment>

Figure 22:
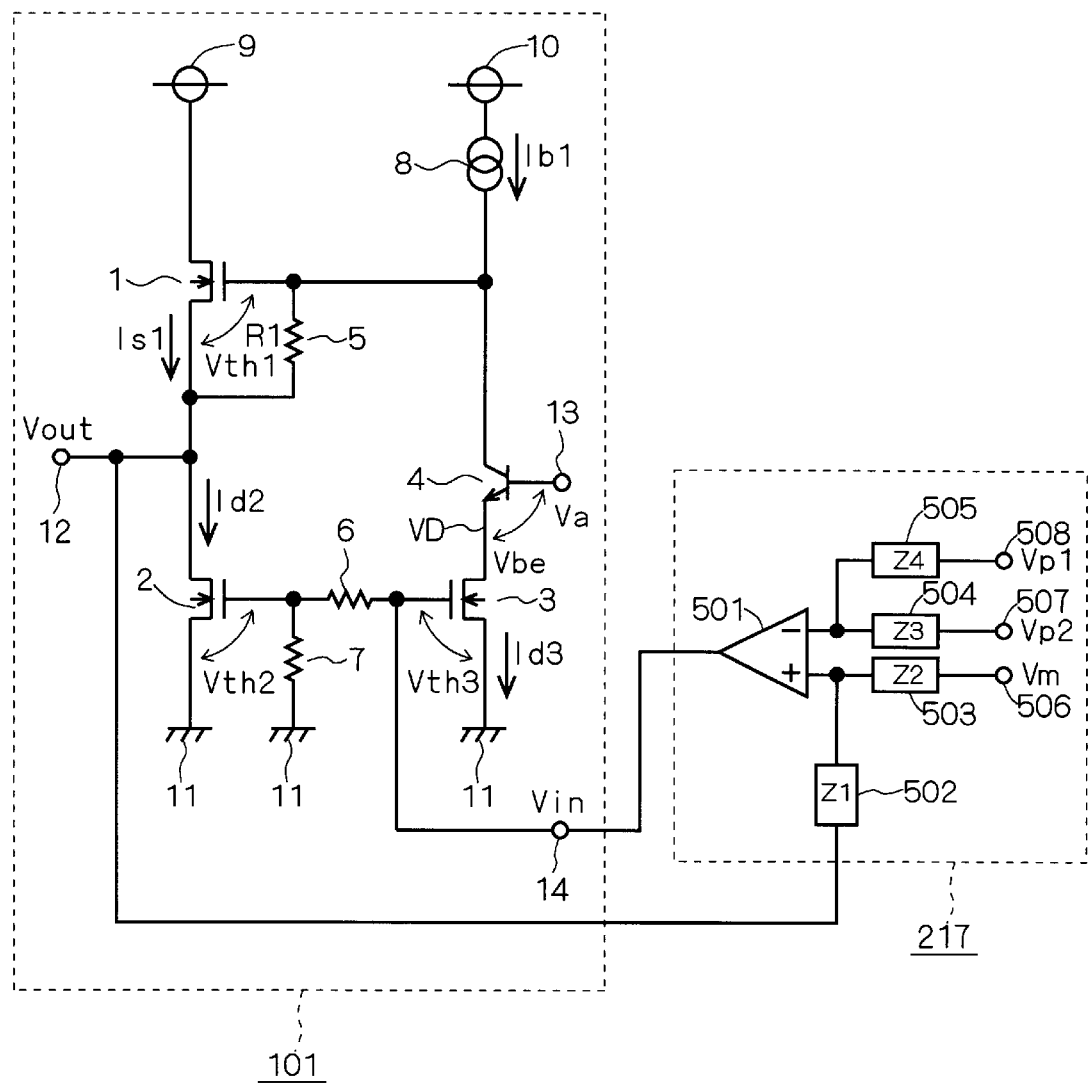
FIG. 22 is a circuit diagram of a device in accordance with a sixth preferred embodiment.

FIG. 22 is a circuit diagram showing a configuration of an amplifying device 113 in accordance with the sixth preferred embodiment. The device 113 is characteristically different from the device 101 (of FIG. 1) in further comprising a preliminary amplifier 217. The preliminary amplifier 217 comprises a differential amplifier 501, impedance elements 502 to 505 and input terminals 506 to 508. An output of the differential amplifier 501 is connected to the input terminal 14. The output terminal 12 is connected to a non-reverse input of the differential amplifier 501 through a negative feedback loop having the impedance element 502.

The input terminal 506 is connected to the non-reverse input of the differential amplifier 501 through the impedance element 503, and the input terminals 507 and 508 are connected to a reverse input of the differential amplifier 501 through the impedance elements 504 and 505, respectively. Values Z1 to Z4 of the impedance elements 502 to 505 can be set at various values from short circuit to open state according to the use of the device 113.

Therefore, it is possible to perform a desired arithmetic operation on input voltages Vm, Vp1 and Vp2 inputted to the input terminals 506 to 508, respectively and draw them out as the output voltage Vout. Moreover, a crossover distortion can be suppressed, and the output voltage Vout of larger dynamic range is obtained. Further, since the MOSFETs 1 and 2 constituting the last output stage are n-channel type MOSFETs, it is possible to achieve high-speed operation and downsizing of the device when the device 113 is incorporated in an IC.

<7. The Seventh Preferred Embodiment>

Figure 23:
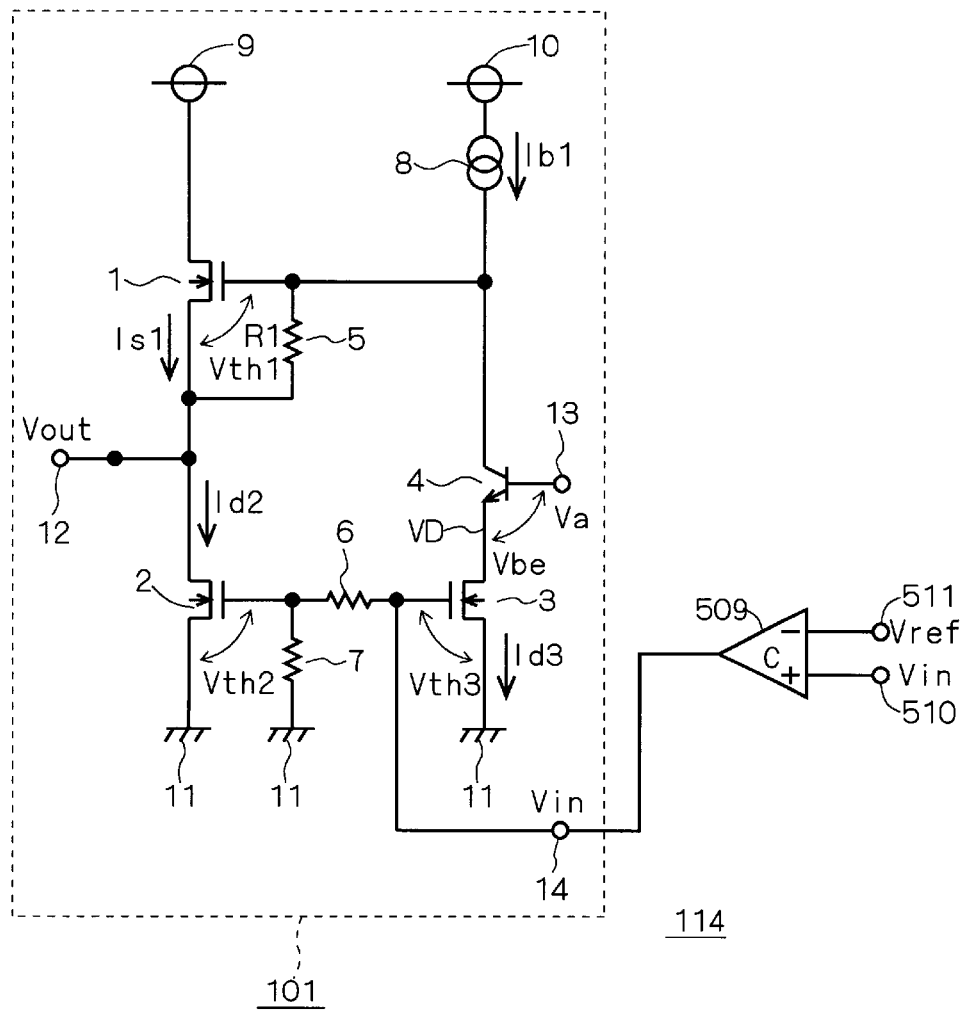
FIG. 23 is a circuit diagram of a device in accordance with a seventh preferred embodiment.

FIG. 23 is a circuit diagram showing a configuration of an amplifying device 114 in accordance with the seventh preferred embodiment. The device 114 is characteristically different from the device 101 (of FIG. 1) in further comprising a comparator 509 and input terminal 510 and 511 as a preliminary amplifier. An output of the comparator 509 is connected to the input terminal 14. The input terminals 510 and 511 are connected to two inputs of the comparator 509, respectively.

The device 114 is equivalent to a circuit with the impedances Z1 and Z4 set open (infinity) and the impedances Z2 and Z3 set short circuit (zero), regarded as an example of the device 113. The device 114 compares the input voltage Vin inputted to the input terminal 510 with the reference voltage Vref inputted to the input terminal 511 and outputs the comparison result as the output voltage Vout.

Figure 24:
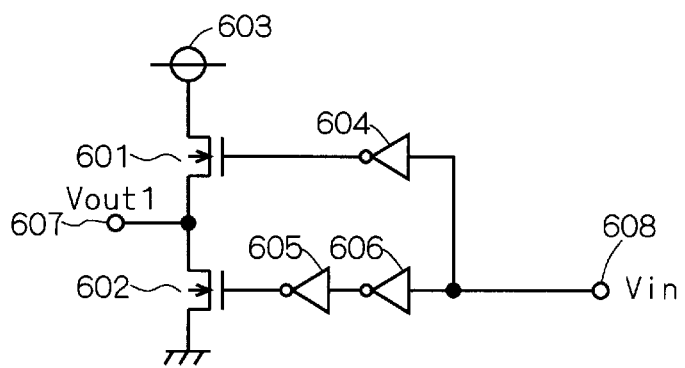
FIG. 24 is a circuit diagram of a background-art device compared with the device of FIG. 23.

FIG. 24 is a circuit diagram showing a configuration of a background-art comparator with current buffer compared with the device 114. FIGS. 25A to 25C are waveform views showing the input voltage and the output voltages outputted in response to the input voltage in the device 114 and the background-art device of FIG. 24, respectively. The comparator of FIG. 24 comprises n-channel type MOSFETs 601 and 602 connected in series which are disposed as current buffers between a positive power supply line 603 and a ground power supply line. An output voltage Vout1 is outputted from an output terminal 607 connected to a node between the MOSFETs 601 and 602.

The input voltage Vin inputted to an input terminal 608 is propagated to a gate electrode of the MOSFET 601 through an inverter 604, and to a gate electrode of the MOSFET 602 through inverters 606 and 605. Hence, the two MOSFETs 601 and 602 are driven in reverse phase to each other.

The comparator has an advantage of simple configuration, but needs an operation period for simultaneously turning the MOSFETs 601 and 602 off in order to prevent a through current from flowing between the positive power supply line 603 and the negative power supply line. In this operation period, since the output terminal 607 comes into a high-impedance state, as shown in FIG. 25B, oscillation, chattering, spike or the like may occur on the output voltage Vout1 in some cases. On the other hand, the device 114, in which the MOSFETs 1 and 2 on the last stage do not simultaneously turn off, suppresses oscillation, chattering, spike or the like on the output voltage Vout as shown in FIG. 25C.

<8. The Eighth Preferred Embodiment>

FIG. 26 is a circuit diagram showing a configuration of an amplifying device 115 in accordance with the eighth preferred embodiment. The device 115 is characteristically different from the device 106 (of FIG. 10) in that a constant current source 203 a compensates not only the variation in the resistance of the resistance element but also the variation in characteristics of the MOSFET 1. In the constant current source 203a, the transistor 47 and the input terminal 50 of the constant current source 203 are removed and instead an n-channel type MOSFET 99 is provided.

A drain electrode of the MOSFET 99 is connected to the output end of the constant current source 48 and the base electrode of the transistor 45. A source electrode of the MOSFET 99 is connected to the ground power supply line 11. A gate electrode of the MOSFET 99 is connected to a node between the emitter electrode of the transistor 45 and the resistance element 46. The MOSFET 99 is paired with the MOSFET 1.

Like in the constant current source 203 (of FIG. 10), the transistors 41 and 42, the resistance elements 43 and 44, and the resistance elements 46 and 5 are paired with each other. Also like in the constant current source 203 (of FIG. 10), common use of the positive power supply line 10 as the positive power supply line 49 is possible.

With the above configuration, the device 115 operates as follows.

The relation between a drain current Id4 and a gate-source voltage Vgs4 of the MOSFET 99 is expressed, using a function f1 representing input/output characteristics of the MOSFET 99, as $$Id4 = f1(Vgs4)$$

Similarly, the relation between a drain current Id1 (=the source current Is1) and the gate-source voltage Vgs1 of the MOSFET 1 is expressed, using a function f2 representing input/output characteristics of the MOSFET 1, as $$Id1 = f2(Vgs1)$$

Assuming that a current supplied by the constant current source 48 is Ibs, a current mirror ratio of the current mirror circuit having the transistors 41 and 42 is 1 and the whole current Ib1 supplied by the transistor 41 flows in the resistance element 5, the drain current id1 of the MOSFET 1 is obtained as $$Id1=f2\{f1^{-1}(Ibs)\cdot R1/R0\}$$

Since the MOSFET 1 and the MOSFET 99 are paired with each other, assuming that the ratio of size between the MOSFET 1 and the MOSFET 99 is S, the following relation is held between the functions f1 and f2:

$$f2=S\cdot f1$$

Since the resistance elements 5 and 46 are paired with each other, the ratio R1/R0 between the resistances R1 and R0 is constant. Assuming the ratio to be 1, the drain current Id1 is expressed as $$Id1=S\cdot Ibs$$

In other words, not only the effect due to the variation in the resistance value R1 of the resistance element 5 but also that in the characteristics of the MOSFET 1 is suppressed, to obtain the stable drain current Id1 which depends only on the constant current Ibs. This also applies to general cases where the current mirror ratio of the current mirror circuit having the transistors 41 and 42 is not 1 and where the ratio R1/R0 is not 1.

When the idling current IId flows in the MOSFETs 1 and 2, the whole current Ib1 do not flow into the resistance element 5 but part of the current Ib1 at a constant ratio flows therein. According to the ratio, the effect on the idling current IId due to the variations in the characteristics of the MOSFET 1 and the resistance R1 can be suppressed. Further, an n-channel type MOSFET may be used as the transistor 45, instead of a bipolar-type transistor. In this configuration, a gate electrode, a source electrode and a drain electrode of the MOSFET correspond to the base electrode, the emitter electrode and the collector electrode of the bipolar transistor, respectively.

<9. The Ninth Preferred Embodiment>

Figure 27:
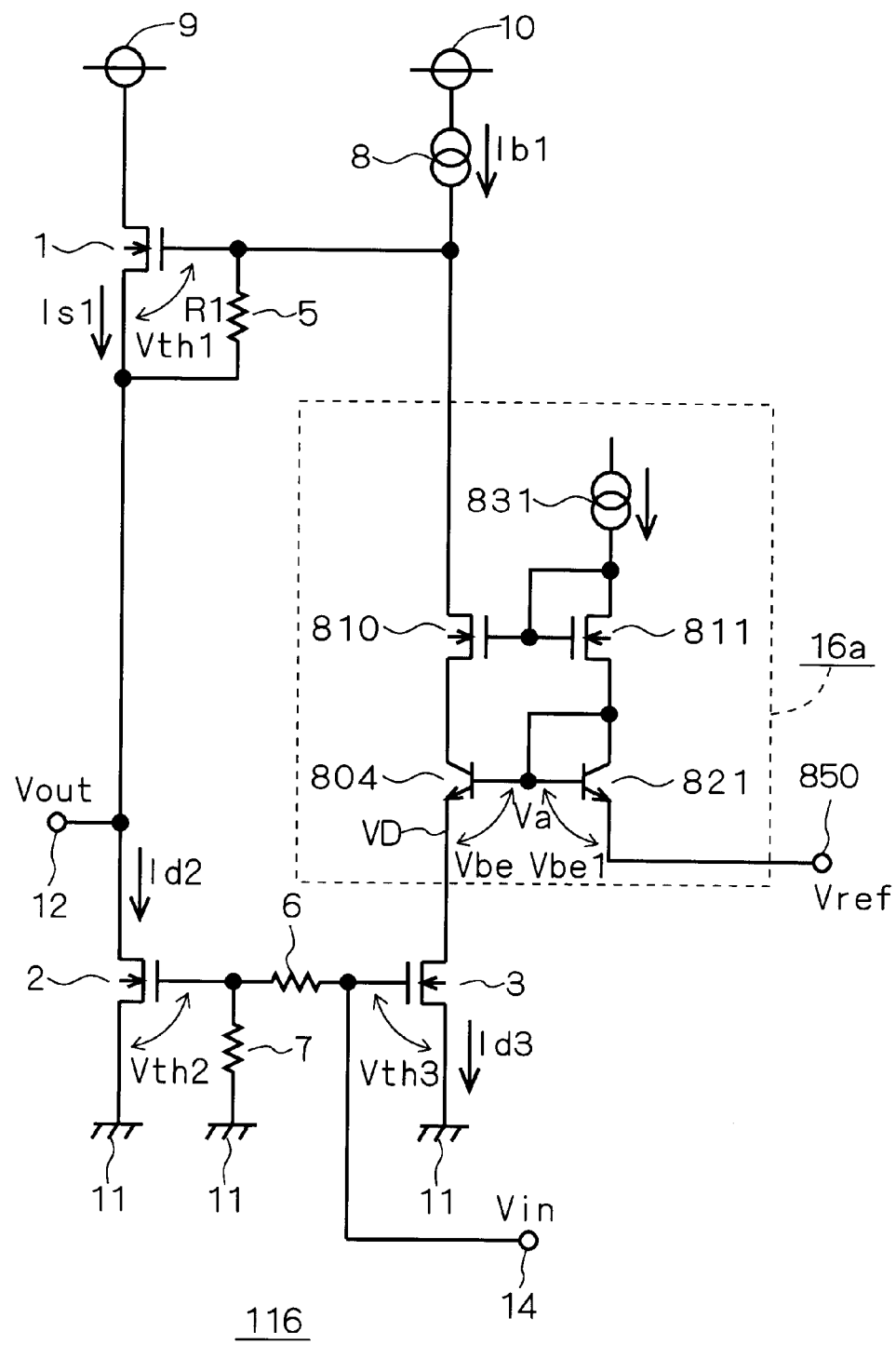
FIG. 27 is a circuit diagram of a device in accordance with a ninth preferred embodiment.
Figure 28:
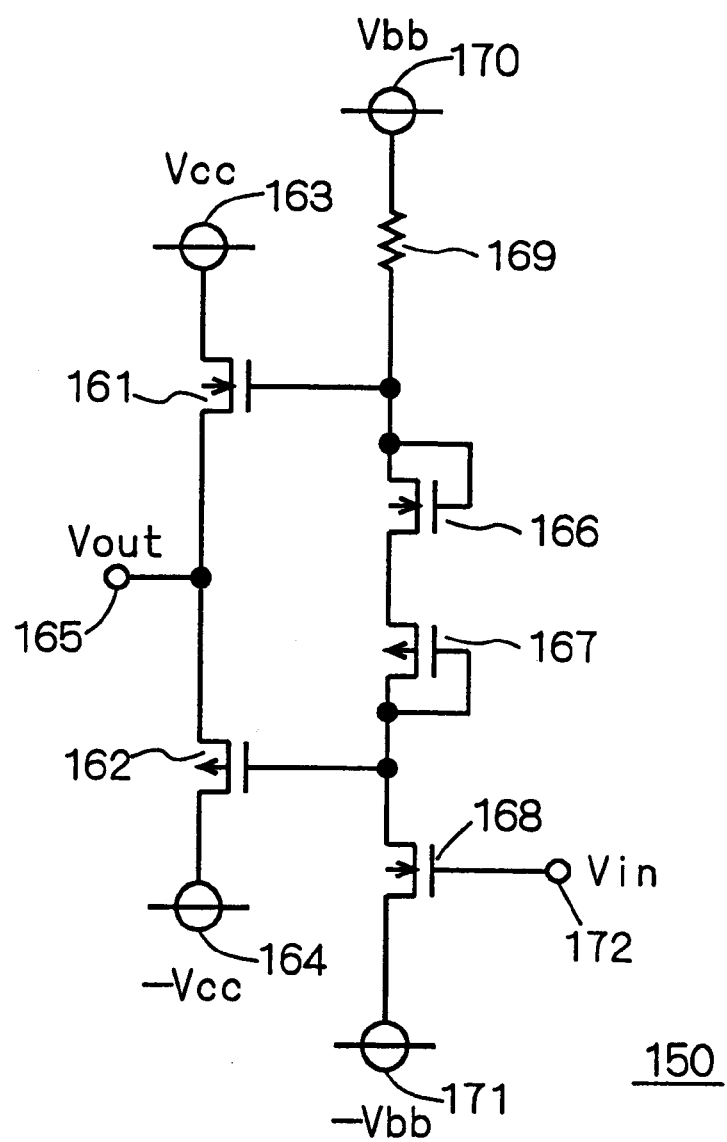
FIG. 28 is a circuit diagram of a device in the background art.

FIG. 27 is a circuit diagram showing a configuration of an amplifying device 116 in accordance with the ninth preferred embodiment. The device 116 comprises a control circuit 16a as another example of the control circuit 16 of FIG. 6. The control circuit 16a comprises an npn bipolar-type transistor 804 corresponding to the transistor 4 in the device 101 of FIG. 1, an npn bipolar-type transistor 821 corresponding to the transistor 21 in the compensating circuit 202 of FIG. 9 and a constant current source 831 corresponding to the constant current source 31 in the compensating circuit 202. The transistors 804 and 821 are paired with each other.

Therefore, in the device 116, like in the device 101 comprising the compensating circuit 202, the drain voltage VD of the MOSFET 3 is stably kept at a value depending on the constant reference voltage Vref applied to the emitter electrode of the transistor 821 through the input terminal 850. In other words, even if the base-emitter voltage Vbe of the transistor 804 varies due to temperature change and the like, the change is compensated by the base-emitter voltage Vbe1 which varies similarly and has no effect on the voltage VD.

In the compensating circuit 202 of FIG. 9, the voltage VD slightly varies as the collector-emitter voltage of the transistor 4 varies. This phenomenon is caused by an Early effect of the transistor 4. This variation in the voltage VD causes variation in the idling current. In contrast, the control circuit 16a has such a configuration as to suppress the variation in the collector-emitter voltage of the transistor 804 as well. It is thereby possible to more stably keep the voltage VD and further stabilize the idling current.

Specifically, the control circuit 16a further comprises n-channel type MOSFETs 810 and 811. The MOSFET 810 is interposed between the constant current source 8 and the transistor 804, and the MOSFET 811 is interposed between the constant current source 831 and the transistor 821.

In more detail, a drain electrode of the MOSFET 810 is connected to an output end of the constant current source 8, and a source electrode is connected to a collector electrode of the transistor 804. A drain electrode of the MOSFET 811 is connected to an output end of the constant current source 831, and a source electrode is connected to a collector electrode of the transistor 821. A gate electrode and the drain electrode of the MOSFET 811 are connected to a gate electrode of the MOSFET 810. Further, the MOSFETs 810 and 811 are paired with each other.

With functions of the MOSFETs 810 and 811, a collector-emitter voltage Vce of the transistor 804 is clamped so that the following equation may be held:

$$Vce=Vbe$$

Therefore, the variation in the voltage VD due to the variation in the collector-emitter voltage Vce is suppressed, to make the idling current more stable.

Further, in the device 101 of FIG. 1, since the collector electrode of the transistor 4 is connected to the gate electrode of the MOSFET 1, the dynamic range of the transistor 4 is large. Therefore, for the transistor 4, it is necessary to adopt an element having high withstand voltage. In contrast, since the collector-emitter voltage Vce of the transistor 804 in the control circuit 16a is kept at low constant value, advantageously, it is not necessary to adopt an element having high withstand voltage between the collector and emitter, for the transistor 804. In the transistor 804, the withstand voltage between the collector and emitter has only to be higher than the base-emitter voltage Vbe.

The MOSFETs 810 and 811 may be replaced by npn bipolar-type transistors.

While the invention has been shown and described in detail, the foregoing description is in all aspects illustrative and not restrictive. It is therefore understood that numerous modifications and variations can be devised without departing from the scope of the invention.

What is claimed is:

1. An amplifying device, comprising:

a first MOSFET having a drain electrode connected to a first power supply line;

a second MOSFET of the same channel type as said first MOSFET, having a source electrode connected to a second power supply line and a drain electrode connected to a source electrode of said first MOSFET;

a third MOSFET of the same channel type as said first MOSFET, having a source electrode connected to said second power supply line and a gate electrode connected to a gate electrode of said second MOSFET;

a first resistance element having two ends, one end being connected to a gate electrode of said first MOSFET and the other end being connected to said source electrode of said first MOSFET;

a control circuit having first to third electrodes, said first electrode being connected to a drain electrode of said third MOSFET, said second electrode being connected to said gate electrode of said first MOSFET, a potential difference between said first electrode and said second power supply line is determined by a voltage applied across said third electrode and said second power supply line, and a current flowing in said second electrode being in proportion to a current flowing in said first electrode; and a first constant current source having an output end connected to said second electrode.

2. An amplifying device, comprising:

a first MOSFET having a drain electrode connected to a first power supply line;

a second MOSFET of the same channel type as said first MOSFET, having a source electrode connected to a second power supply line and a drain electrode connected to a source electrode of said first MOSFET;

a third MOSFET of the same channel type as said first MOSFET, having a source electrode connected to said second power supply line and a gate electrode connected to a gate electrode of said second MOSFET;

a first resistance element having two ends, one end being connected to a gate electrode of said first MOSFET and the other end being connected to said source electrode of said first MOSFET;

a first transistor having a first main electrode connected to a drain electrode of said third MOSFET, a second main electrode connected to said gate electrode of said first MOSFET and a control electrode, in which a current flowing in said second main electrode is controlled by a potential difference between said control electrode and said first main electrode; and a first constant current source having an output end connected to said second electrode.

3. The amplifying device according to claim 2, wherein said first transistor is a bipolar transistor.

4. The amplifying device according to claim 2, wherein said first transistor is a MOSFET of the same channel type as said first to third MOSFETs.

5. The amplifying device according to claim 2 further comprising:

a second resistance element having two ends, one end being connected to said gate electrode of said second MOSFET and the other end being connected to said gate electrode of said third MOSFET; and a third resistance element having two ends, one end being connected to said gate electrode of said second MOSFET and the other end being connected to said second power supply line.

6. The amplifying device according to claim 2 further comprising:

a compensating circuit for compensating said potential difference between said control electrode and said first main electrode of said first transistor, wherein said compensating circuit comprises a constant voltage circuit for outputting a constant voltage relative to said second power supply line to an output end thereof;

a second transistor having a first main electrode connected to said output end of said constant voltage circuit, a second main electrode and a control electrode both of which are connected to said control electrode of said first transistor; and a second constant current source having an output end connected to said second main electrode of said second transistor.

7. The amplifying device according to claim 6, wherein said second transistor is paired with said first transistor.

8. The amplifying device according to claim 2 further comprising:

a compensating circuit for compensating voltage dependency of a current in said first MOSFET, wherein said compensating circuit comprises a fourth MOSFET of the same channel type as said first to third MOSFETs, having a drain electrode connected to said first power supply line;

a second resistance element having two ends, one end being connected to a source electrode of said fourth MOSFET and the other end being connected to a gate electrode of said fourth MOSFET;

a second constant current source for supplying a constant current for said second resistance element;

a feedback circuit for propagating variation in potential of a node between said source electrode of said first MOSFET and said drain electrode of said second MOSFET to said source electrode of said fourth MOSFET; and a current control circuit for diluting a current flowing in said first resistance element with a current proportional to a current flowing in said fourth MOSFET.

9. The amplifying device according to claim 8, wherein said fourth MOSFET is paired with said first MOSFET, said second resistance element is paired with said first resistance element, and said second constant current source is paired with said first constant current source.

10. The amplifying device according to claim 2 further comprising:

an amplifier having an output connected to said gate electrode of said third MOSFET.

11. The amplifying device according to claim 10, wherein said amplifier is a differential amplifier having a non-reverse input and a reverse input, said amplifying device further comprising:

a negative feedback loop for connecting said non-reverse input to a node between said source electrode of said first MOSFET and said drain electrode of said second MOSFET.

12. The amplifying device according to claim 2, further comprising:

a fourth MOSFET of the same channel type as said first MOSFET, having a drain electrode connected to said first power supply line;

a second resistance element having two ends, one end being connected to a source electrode of said fourth MOSFET and the other end being connected to a gate electrode of said fourth MOSFET;

a second constant current source for supplying a constant current for said second resistance element;

a second transistor having a first main electrode connected to said source electrode of said fourth MOSFET, a control electrode connected to said source electrode of said first MOSFET, and a second main electrode; and a current mirror circuit having two output ends respectively connected to said output end of said first constant current source and said second main electrode of said second transistor.

13. The amplifying device according to claim 2, further comprising:

a fourth MOSFET of the same channel type as said first MOSFET, having a drain electrode connected to said first power supply line;

a second resistance element having two ends, one end being connected to a source electrode of said fourth MOSFET and the other end being connected to a gate electrode of said fourth MOSFET;

a second constant current source for supplying a constant current for said second resistance element;

a second transistor having a first main electrode connected to said source electrode of said fourth MOSFET, a control electrode connected to said source electrode of said first MOSFET, and a second main electrode;

a third transistor of the same conductivity type as said first transistor having a first main electrode connected to said second main electrode of said second transistor, a control electrode connected to said control electrode of said first transistor, and a second main electrode;

a third resistance element having two ends, one end being connected to said first main electrode of said third transistor and the other end being connected to said second power supply line; and a third current source having an output end connected to said second main electrode of said third transistor.

14. The amplifying device according to claim 2, wherein said first constant current source comprises:

a fourth MOSFET of the same channel type as said first MOSFET;

a second resistance element having ends, one of said ends being connected to a gate electrode of said fourth MOSFET and the other being connected to a source electrode of said fourth MOSFET;

a second constant current source having an output end connected to a drain electrode of said fourth MOSFET;

a second transistor having a first main electrode and a control electrode connected to said gate electrode and said drain electrode of said fourth MOSFET, respectively; and a current mirror circuit for outputting a current in proportion to a main current flowing in said second transistor from said output end of said first constant current source.

15. The amplifying device according to claim 14, wherein said second transistor is a bipolar transistor.

16. The amplifying device according to claim 14, wherein said fourth resistance element is paired with said first resistance element, and said fourth MOSFET is paired with said first MOSFET.

17. The amplifying device according to claim 2, further comprising:

a second transistor of the same conductivity type as said first transistor, having a first main electrode to which a voltage is applicable and a second main electrode and a control electrode which are connected to said control electrode of said first transistor;

a third transistor having a first main electrode connected to said second main electrode of said first transistor and a second main electrode connected to said output end of said first constant source, thereby being interposed between said first transistor and said output end;

a fourth transistor of the same conductivity type as said third transistor, having a first main electrode connected to said second main electrode of said second transistor and a second main electrode and a control electrode which are connected to a control electrode of said third transistor; and a second constant current source having an output end connected to said second main electrode of said fourth transistor.

18. The amplifying device according to claim 17, wherein both said first and second transistors are bipolar transistors.

19. The amplifying device according to claim 17, wherein both said third and fourth transistors are MOSFETs.

20. The amplifying device according to claim 17, wherein said second transistor is paired with said first transistor, and said fourth transistor is paired with said third transistor.

* * * * *